(12) United States Patent
Obu et al.

(10) Patent No.: US 10,475,717 B2
(45) Date of Patent: Nov. 12, 2019

(54) SEMICONDUCTOR CHIP, METHOD FOR MOUNTING SEMICONDUCTOR CHIP, AND MODULE IN WHICH SEMICONDUCTOR CHIP IS PACKAGED

(71) Applicant: Murata Manufacturing Co., Ltd., Kyoto (JP)

(72) Inventors: Isao Obu, Kyoto (JP); Yasunari Umemoto, Kyoto (JP); Masahiro Shibata, Kyoto (JP)

(73) Assignee: MURATA MANUFACTURING CO., LTD., Kyoto (JP)

( * ) Notice: Subject to any disclaimer, the term of this patent is extended or adjusted under 35 U.S.C. 154(b) by 0 days.

(21) Appl. No.: 15/899,010

(22) Filed: Feb. 19, 2018

(65) Prior Publication Data

US 2018/0240725 A1 Aug. 23, 2018

(30) Foreign Application Priority Data

Feb. 21, 2017 (JP) .................. 2017-030141

(51) Int. Cl.
*H01L 21/00* (2006.01)
*H01L 23/31* (2006.01)
(Continued)

(52) U.S. Cl.
CPC .......... *H01L 23/3114* (2013.01); *H01L 21/52* (2013.01); *H01L 21/561* (2013.01); *H01L 21/568* (2013.01); *H01L 21/67* (2013.01); *H01L 21/6835* (2013.01); *H01L 21/76898* (2013.01); *H01L 23/481* (2013.01); *H01L 23/498* (2013.01); *H01L 23/4952* (2013.01); *H01L 24/48* (2013.01); *H01L 23/3121* (2013.01); *H01L 23/3677* (2013.01); *H01L 2221/6834* (2013.01); *H01L 2221/68327* (2013.01); *H01L 2224/18* (2013.01); *H01L 2224/32225* (2013.01); *H01L 2224/48091* (2013.01);
(Continued)

(58) Field of Classification Search
CPC ..... H01L 23/3114; H01L 21/561; H01L 21/52
See application file for complete search history.

(56) References Cited

U.S. PATENT DOCUMENTS 4,053,335 A * 10/1977 Hu ................ H01L 21/02164
438/143
7,335,574 B2 * 2/2008 Okuda ............... H01L 21/6835
257/E21.237
(Continued)

FOREIGN PATENT DOCUMENTS

JP H04312933 A 11/1992
JP 2000-332343 A 11/2000
(Continued)

OTHER PUBLICATIONS

Notice of Reasons for Rejection for Japanese Patent Application No. 2017-030141, dated Apr. 23, 2019.

*Primary Examiner* — Laura M Menz
(74) *Attorney, Agent, or Firm* — Pearne & Gordon LLP

(57) ABSTRACT

A semiconductor chip includes a single-crystal substrate and a metal electrode on the bottom surface of the substrate. The metal electrode has a region in which a first metal is exposed and a region in which a second metal is exposed, the second metal having a standard electrode potential different from that of the first metal.

9 Claims, 21 Drawing Sheets

(51) Int. Cl.
*H01L 23/495* (2006.01)
*H01L 23/00* (2006.01)
*H01L 21/67* (2006.01)
*H01L 21/56* (2006.01)
*H01L 21/52* (2006.01)
*H01L 23/48* (2006.01)
*H01L 23/498* (2006.01)
*H01L 21/683* (2006.01)
*H01L 21/768* (2006.01)
*H01L 23/367* (2006.01)

(52) U.S. Cl.
CPC ............ *H01L 2224/48227* (2013.01); *H01L 2224/73265* (2013.01); *H01L 2924/181* (2013.01)

(56) References Cited

U.S. PATENT DOCUMENTS

| | | | | |
|---|---|---|---|---|
| 9,252,064 B2* | 2/2016 | Tsai | ................ | H01L 23/041 |
| 9,543,270 B1* | 1/2017 | Kuan | ................ | H01L 24/09 |
| 9,613,830 B2* | 4/2017 | Scanlan | ................ | H01L 21/78 |
| 9,614,258 B2* | 4/2017 | Takahashi | ............ | H01M 10/48 |
| 9,653,414 B2* | 5/2017 | Gulpen | ................ | H01L 23/60 |
| 9,761,545 B2* | 9/2017 | Sin | ................ | H01L 23/645 |
| 9,773,697 B2* | 9/2017 | Tsukiyama | ........ | H01L 21/76826 |
| 2004/0017419 A1* | 1/2004 | Lai | ............ | B41J 2/16 347/20 |
| 2013/0270705 A1 | 10/2013 | Wang et al. | | |
| 2016/0351441 A1 | 12/2016 | Tsukiyama et al. | | |
| 2017/0040279 A1 | 2/2017 | Chiu et al. | | |

FOREIGN PATENT DOCUMENTS

| | | |
|---|---|---|
| JP | 2002-094223 A | 3/2002 |
| JP | 2008135612 A | 6/2008 |
| JP | 2010-245227 A | 10/2010 |
| JP | 2015-207699 A | 11/2015 |
| TW | 201342556 A | 10/2013 |
| TW | 201639109 A | 11/2016 |
| TW | 201642370 A | 12/2016 |

* cited by examiner

FIG. 4

| ELEMENT | REACTION | STANDARD ELECTRODE POTENTIAL (V) |
|---|---|---|
| MAGNESIUM | $Mg^{2+} + 2e \rightarrow Mg$ | -2.36 |
| THORIUM | $Th^{4+} + 4e \rightarrow Th$ | -1.90 |
| BERYLLIUM | $Be^{3+} + 3e \rightarrow Be$ | -1.85 |
| ALUMINUM | $Al^{3+} + 3e \rightarrow Al$ | -1.70 |
| TITANIUM | $Ti^{2+} + 2e \rightarrow Ti$ | -1.63 |
| ZIRCONIUM | $Zr^{4+} + 4e \rightarrow Zr$ | -1.53 |
| MANGANESE | $Mn^{2+} + 2e \rightarrow Mn$ | -1.18 |
| ZINC | $Zn^{2+} + 2e \rightarrow Zn$ | -0.76 |
| IRON | $Fe^{2+} + 2e \rightarrow Fe$ | -0.44 |
| CADMIUM | $Cd^{2+} + 2e \rightarrow Cd$ | -0.40 |
| COBALT | $Co^{2+} + 2e \rightarrow Co$ | -0.28 |
| NICKEL | $Ni^{2+} + 2e \rightarrow Ni$ | -0.25 |
| TIN | $Sn^{2+} + 2e \rightarrow Sn$ | -0.14 |
| LEAD | $Pb^{2+} + 2e \rightarrow Pb$ | -0.13 |
| COPPER | $Cu^{2+} + 2e \rightarrow Cu$ | +0.34 |
| SILVER | $Ag^{+} + e \rightarrow Ag$ | +0.80 |
| PALLADIUM | $Pd^{2+} + 2e \rightarrow Pd$ | +0.99 |
| GOLD | $Au^{3+} + 3e \rightarrow Au$ | +1.50 |

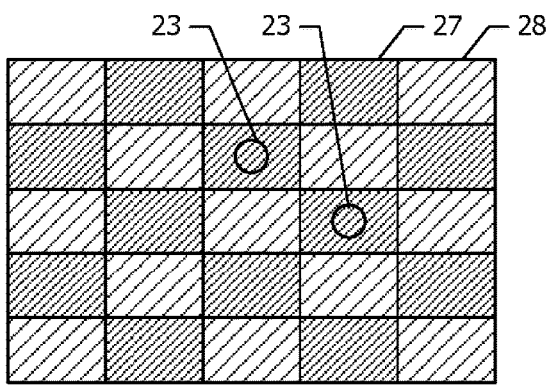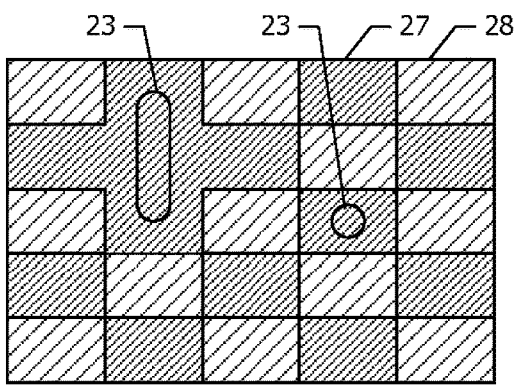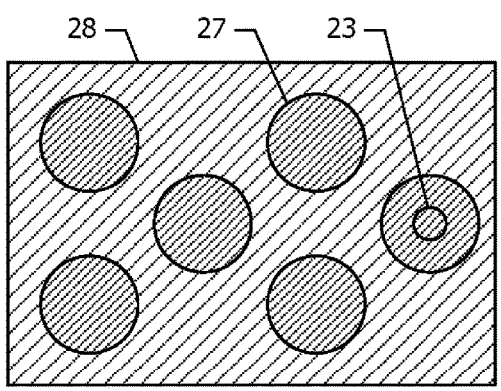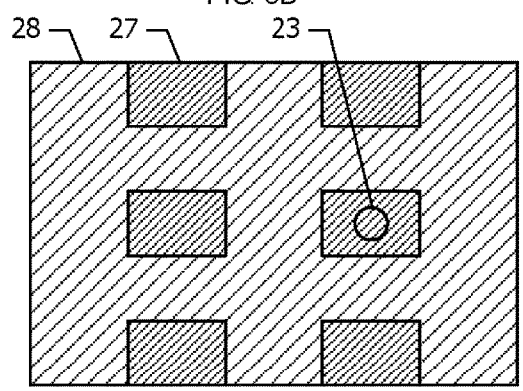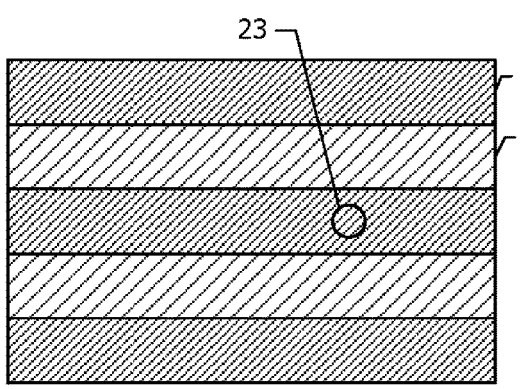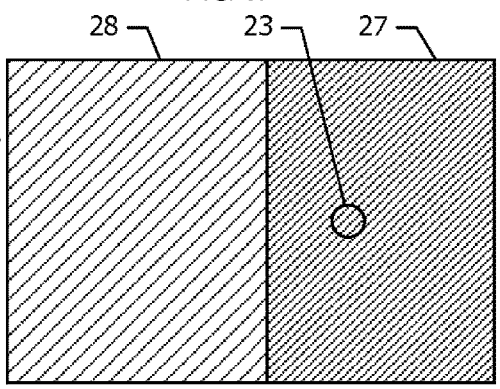

SEMICONDUCTOR CHIP, METHOD FOR MOUNTING SEMICONDUCTOR CHIP, AND MODULE IN WHICH SEMICONDUCTOR CHIP IS PACKAGED

This application claims priority from Japanese Patent Application No. 2017-030141 filed on Feb. 21, 2017. The content of this application is incorporated herein by reference in its entirety.

BACKGROUND OF THE DISCLOSURE

1. Field of the Disclosure

The present disclosure relates to a semiconductor chip, a method for mounting a semiconductor chip, and a module in which a semiconductor chip is packaged.

2. Description of the Related Art

A major component of a cellular-phone terminal is a power amplifier module. In a power amplifier module, in general, a compound semiconductor device is used. The market demand for higher reliability of the components of cellular phone terminals has been continuing to grow. For example, it is required that their characteristics remain unchanged even when high-temperature reflow soldering is performed after moisture absorption in a harsh, high-temperature and high-humidity environment. High-temperature reflow soldering under such conditions can cause the compound semiconductor chip to delaminate from the module substrate. There is a great need for further improvement in the strength of the bonding of a compound semiconductor chip to a module substrate, as a measure to prevent the delamination of compound semiconductor chips.

Japanese Unexamined Patent Application Publication No. 4-312933 discloses a semiconductor unit that includes a die pad and a semiconductor element (semiconductor chip) bonded thereto and offers the advantage of improved adhesion. This semiconductor unit has hemispherical depressions in the bonding surface of the semiconductor element as a measure to improve adhesion.

The improved adhesion offered by the semiconductor unit disclosed in Japanese Unexamined Patent Application Publication No. 4-312933 results from an increased area of bonding between an adhesive and the semiconductor element. With the reinforcement of adhesion through an increased area of bonding alone, however, the semiconductor unit may be insufficiently reliable and fail to withstand various treatments performed in harsh environments, such as high temperatures and high humidity.

BRIEF SUMMARY OF THE DISCLOSURE

An object of the present disclosure is to provide a semiconductor chip that maintains sufficiently strong adhesion even if processed in a harsh environment. Another object of the present disclosure is to provide a method for mounting a semiconductor chip that maintains sufficiently strong adhesion even if processed in a harsh environment. Yet another object of the present disclosure is to provide a module that includes such a semiconductor chip.

According to preferred embodiments of a first aspect of the present disclosure, a semiconductor chip includes a single-crystal substrate; and a metal electrode on the bottom surface of the substrate, the metal electrode having a region in which a first metal is exposed and a region in which a second metal is exposed, the second metal having a standard electrode potential different from that of the first metal.

Of the first metal and the second metal, the one with the lower standard electrode potential is more likely to form an oxide layer on its surface. This oxide layer acts to improve adhesion to the adhesive. The metal with the higher standard electrode potential is inert to oxidation, ensuring that good electrical characteristics are retained. As a result, the adhesion between the semiconductor chip and the adhesive is strengthened with little loss of electrical characteristics.

According to preferred embodiments of a second aspect of the present disclosure, a semiconductor chip has the structure of a semiconductor chip according to the first aspect, and the surface of a region in which the first metal is exposed and the surface of a region in which the second metal is exposed are at different levels with respect to the bottom surface of the substrate.

In this structure, there is a difference in height between the region in which the first metal is exposed and the region in which the second metal is exposed. As a result, the metal electrode has a larger surface area than the one with a flat surface. The increase in surface area acts to strengthen the adhesion between the metal electrode and the adhesive.

According to preferred embodiments of a third aspect of the present disclosure, a semiconductor chip has, in addition to the structure of a semiconductor chip according to the first or second aspect, an element assembly on the top surface of the substrate, the element assembly including at least one semiconductor element; and a via hole extending from the bottom surface to the top surface of the substrate. The metal electrode runs through the via hole to be electrically coupled to the element assembly.

In this configuration, by fastening the metal electrode on the bottom surface to a module substrate, for example to a die pad on it, using an electroconductive member, it is possible to electrically couple the module substrate and the element assembly together.

According to preferred embodiments of a fourth aspect of the present disclosure, a semiconductor chip has the structure of a semiconductor chip according to the third aspect, and the via hole does not overlap with the boundary between the region of the metal electrode in which the first metal is exposed and the region in which the second metal is exposed.

In the process of defining the boundary between the region in which the first metal is exposed and the region in which the second metal is exposed, the occurrence of in-process defects is reduced.

According to preferred embodiments of a fifth aspect of the present disclosure, a semiconductor chip has the structure of a semiconductor chip according to the first, second, third, or fourth aspects, and one of the first metal and the second metal is copper, and the other is gold.

Gold has a standard electrode potential higher than that of copper and is much less oxidizable than other metals. Hence, the use of gold as one of the first metal and the second metal leads to more effective retention of electrical characteristics. Copper is a metal commonly used in electrodes, and, thus, the use of copper as one of the first metal and the second metal leads to lower costs.

According to preferred embodiments of a sixth aspect of the present disclosure, a module includes a module substrate with a die pad on the surface thereof; a semiconductor chip with a metal electrode on the bottom surface thereof, the metal electrode having a region in which a first metal is exposed and a region in which a second metal is exposed, the second metal having a standard electrode potential different from that of the first metal; and an electroconductive adhesive layer bonding the metal electrode on the semiconductor chip to the die pad on the module substrate.

Of the first metal and the second metal, the one with the lower standard electrode potential is more likely to form an oxide layer on its surface. This oxide layer provides improved adhesion to the adhesive. The metal with the higher standard electrode potential is inert to oxidation, ensuring that good electrical characteristics are retained. As a result, the adhesion between the semiconductor chip and the adhesive is strengthened with little increase in the electrical resistance between the die pad and the metal electrode.

According to preferred embodiments of a seventh aspect of the present disclosure, a module has the structure of a module according to the sixth aspect, and the adhesive layer contains a resin that has a functional group capable of hydrogen bonding with oxygen atoms bound to the metal electrode.

The hydrogen bonding between oxygen atoms in the oxide layer on the surface of the metal electrode and the functional group in the adhesive layer reinforces the adhesion between the metal electrode and the adhesive layer.

According to preferred embodiments of an eighth aspect of the present disclosure, a method for mounting a semiconductor chip includes preparing a module substrate with a die pad on the surface thereof and a semiconductor chip with a metal electrode on the bottom surface thereof, the metal electrode including a first metal film, made of a first metal, and a second metal film, made of a second metal having a standard electrode potential different from that of the first metal, on a part of the surface of the first metal film; and mounting, using solder, the semiconductor chip onto the module substrate with the bottom surface of the semiconductor chip facing the die pad. In the mounting of the semiconductor chip onto the module substrate, the second metal film of the semiconductor chip is dissolved in the solder.

This semiconductor chip, as in the module according to the sixth aspect, can be mounted onto a module substrate using an electroconductive adhesive. Alternatively, this semiconductor chip can be firmly fastened to a module substrate by soldering. That is, both adhesive- and solder-mounting can be applied to this semiconductor chip.

According to preferred embodiments of a ninth aspect of the present disclosure, a module includes a module substrate with a die pad on the surface thereof; a semiconductor chip including a first metal film, made of a first metal, on the bottom surface thereof; and a solder layer interposed between the first metal film of the semiconductor chip and the die pad on the module substrate with the first metal film facing the die pad, the solder layer fixing the first metal film to the die pad. The solder layer contains gold in addition to the elements constituting the solder, and the gold content thereof is about 1% by mass or more and about 35% by mass or less.

This module is obtained by mounting a semiconductor chip onto a module substrate using a mounting method according to the eighth aspect.

Other features, elements, characteristics and advantages of the present disclosure will become more apparent from the following detailed description of preferred embodiments of the present disclosure with reference to the attached drawings.

BRIEF DESCRIPTION OF THE SEVERAL VIEWS OF THE DRAWINGS

FIG. 4 is a chart listing various metals, the formulae of their reducing reactions, and the standard electrode potentials of the metals;

FIGS. 5A to 5F are bottom views of the metal electrode of semiconductor chips according to variations of Embodiment 1;

DETAILED DESCRIPTION OF THE DISCLOSURE

Embodiment 1

The following describes a semiconductor chip and a module according to Embodiment 1 with reference to FIGS. 1A to 3.

Figure 1A:
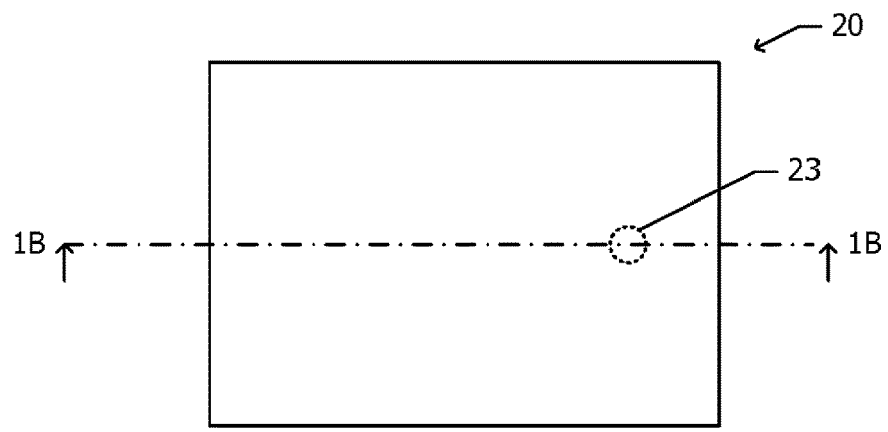
FIG. 1A is a plan view of a semiconductor chip according to Embodiment 1.
Figure 1B:
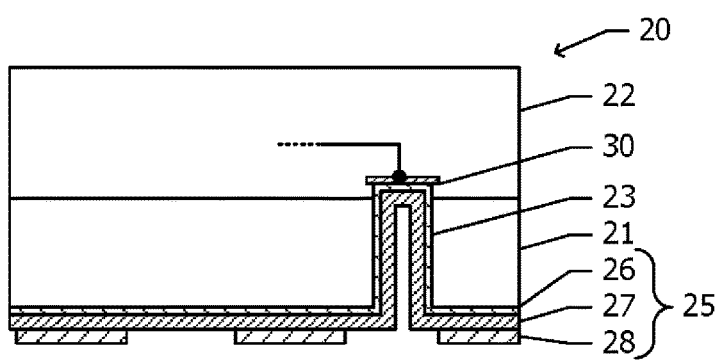
FIG. 1B is a cross-sectional view taken along the dash-dotted line 1B-1B of FIG. 1A.
Figure 1C:
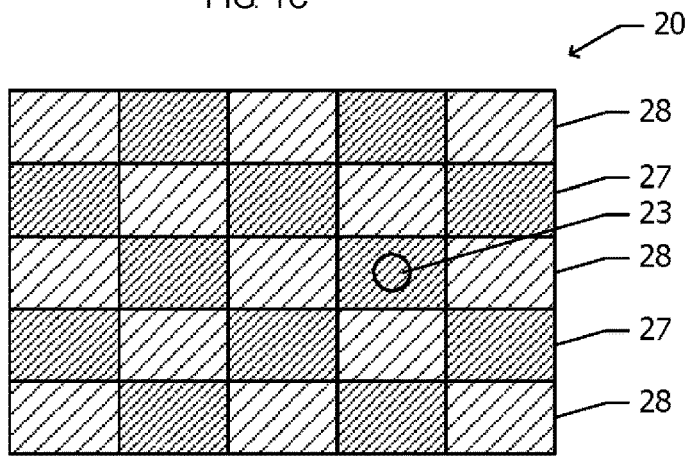
FIG. 1C is a bottom view of the semiconductor chip according to Embodiment 1.

FIG. 1A is a plan view of a semiconductor chip 20 according to Embodiment 1, FIG. 1B is a cross-sectional view taken along the dash-dotted line 1B-1B of FIG. 1A, and FIG. 1C is a bottom view of the semiconductor chip 20 according to Embodiment 1. The semiconductor chip 20 according to Embodiment 1 includes a single-crystal compound semiconductor substrate 21, such as a single-crystal GaAs substrate, and an element assembly 22 on the top surface of the substrate 21. The element assembly 22 includes, for example, multiple active and/or passive elements, wiring between the elements, an interlayer insulating film, and a passivation film. Examples of active elements include heterojunction bipolar transistors (HBTs), field effect transistors (FETs), high electron mobility transistors (HEMTs), laser diodes (LDs), and photodiodes, and examples of passive elements include resistors, capacitors, and inductors. The active elements, passive elements, and wiring form an electrical circuit. In certain configurations, the element assembly 22 may be a part of an active element formed by the substrate 21 and the element assembly 22.

On the bottom surface, opposite to the top surface, of the substrate 21 is a metal electrode 25. At least one via hole 23 extends through the substrate 21 from the bottom surface of the substrate 21, reaching the element assembly 22. The via hole 23 has a substantially round cross-section parallel to the top surface of the substrate 21 (horizontal cross-section). At the end of the element assembly 22 side of the via hole 23 is a via-hole coupling pad 30.

The metal electrode 25 includes a base film 26, a first metal film 27, made of a first metal, on the base film 26, and a second metal film 28, made of a second metal, on the first metal film 27. The base film 26 and the first metal film 27 cover the entire bottom surface of the substrate 21 and the sides and bottom surface of the via hole 23. The second metal film 28 covers a part of the surface of the first metal film 27, which is on the bottom surface of the substrate 21. For example, the second metal film 28 is substantially in a checkerboard pattern as illustrated in FIG. 1C. The metal electrode 25 has regions in which the first metal is exposed (first metal regions) and regions in which the second metal is exposed (second metal regions). The via hole 23 does not overlap with a boundary between a first metal region and a second metal region. For example, the via hole 23 is in a first metal region.

The first and second metals have different standard electrode potentials. The metal electrode 25, on the bottom surface of the substrate 21, is electrically coupled to a conductor portion of the element assembly 22 by the portions of the base film 26 and first metal film 27 extending inside the via hole 23 and by the via-hole coupling pad 30.

The via hole 23 is, for example, about 50 μm or more and about 70 μm or less across. The base film 26 is, for example, a two-layer film composed of a titanium (Ti) film and a copper (Cu) film, with the Ti film on the substrate 21. The Ti and Cu films are, for example, both about 0.1 μm thick. The first metal film 27 is, for example a Cu film about 4 μm thick. The second metal film 28 is, for example, a gold (Au) film about 4 μm thick.

Figure 2:
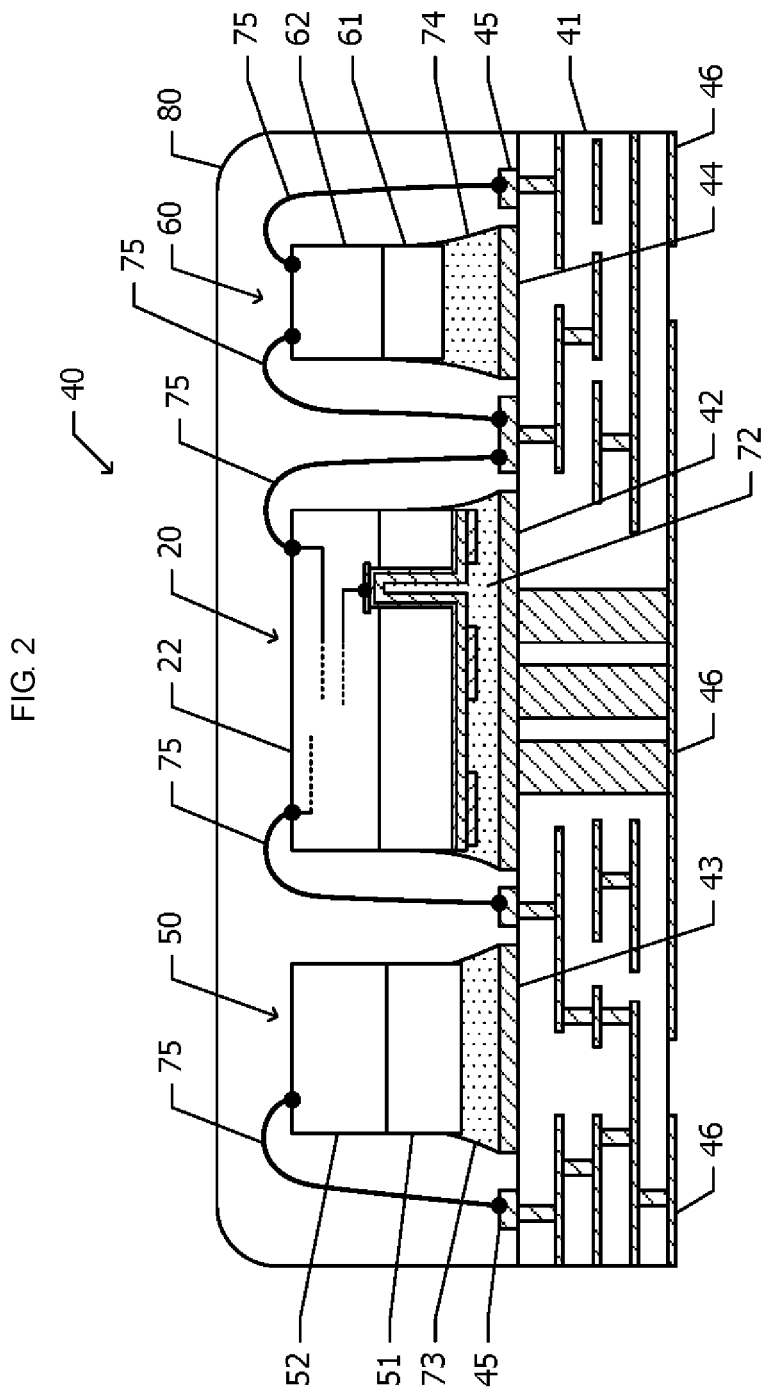
FIG. 2 is a cross-sectional view of a module in which a semiconductor chip according to Embodiment 1 is packaged.

FIG. 2 is a cross-sectional view of a module 40 according to Embodiment 1. The module 40, for example a power amplifier module, includes a module substrate 41 and semiconductor chips 20, 50, and 60 mounted thereon. The module substrate 41 can be, for example, a multilayer printed circuit board. The semiconductor chip 20 is the same as that illustrated in FIGS. 1A to 1C. The semiconductor chip 50, for example a control silicon semiconductor chip, includes a silicon substrate 51 and an element assembly 52 thereon, such as a CMOS. The semiconductor chip 60, for example a switching compound semiconductor chip, includes a semi-insulating GaAs substrate 61 and an element assembly 62 thereon, such as an HEMT.

On the component surface of the module substrate 41 are die pads 42, 43, and 44 and multiple bonding pads 45. The semiconductor chip 20 is fixed to the die pad 42 by an electroconductive adhesive layer 72, with the surface on the metal electrode 25 side facing the module substrate 41. The metal electrode 25 is electrically coupled to the die pad 42 by the electroconductive adhesive layer 72. The silicon substrate 51 of the semiconductor chip 50 is fastened to the die pad 43 by an adhesive layer 73. The semi-insulating GaAs substrate 61 of the semiconductor chip 60 is fastened to the die pad 44 by an adhesive layer 74.

The element assembly 22 of the semiconductor chip 20 is connected to multiple bonding pads 45 by multiple bonding wires 75. The element assembly 52 of the semiconductor chip 50 is connected to multiple bonding pads 45 by multiple bonding wires 75 (only one illustrated in FIG. 2). The element assembly 62 of the semiconductor chip 60 is connected to multiple bonding pads 45 by multiple bonding wires 75. The bonding wires 75 are, for example, gold wires. The semiconductor chips 20, 50, and 60 and the multiple bonding wires 75 are sealed with a sealing cured resin 80. The die pad 42 and the multiple bonding pads 45 are electrically coupled to electrodes 46 on the bottom surface of the module substrate 41 by multilayer wiring in the module substrate 41.

The electroconductive adhesive layer 72 is a layer of an electroconductive adhesive that is primarily epoxy resin in which electroconductive microparticles, such as microparticles of silver (Ag), are dispersed. The electroconductive adhesive layer 72 mechanically fastens the semiconductor chip 20 to the die pad 42 while electrically coupling the metal electrode 25 and the die pad 42 together.

The adhesive layers 73 and 74 mechanically fasten the semiconductor chips 50 and 60, respectively, to the die pads 43 and 44, respectively. To simplify the production process, the formation of the adhesive layers 73 and 74 uses the same adhesive as in the electroconductive adhesive layer 72. It should be understood that the adhesive used in the adhesive layers 73 and 74 may be insulating, because the adhesive layers 73 and 74 do not need to be electroconductive.

Advantages of Embodiment 1

Figure 3:
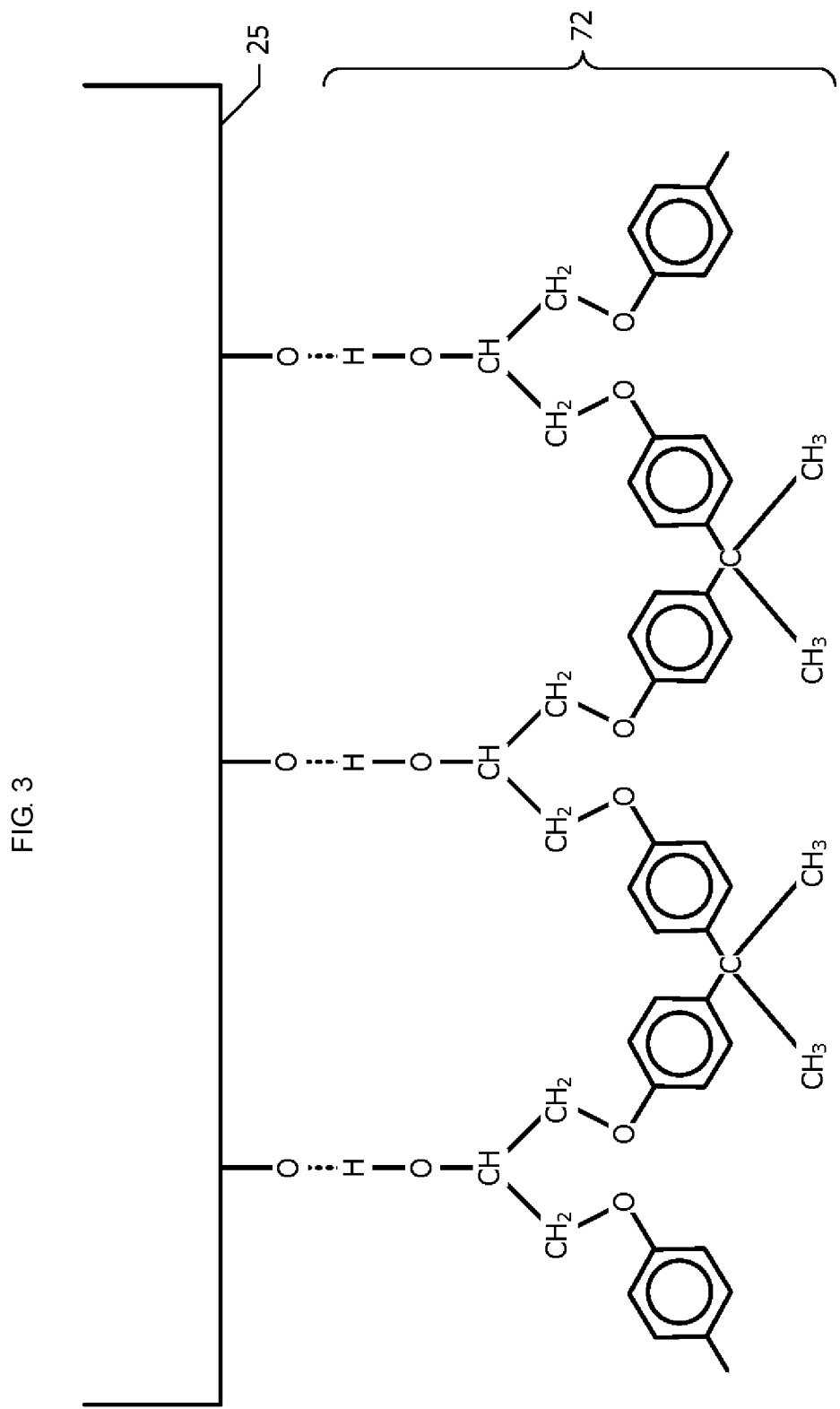
FIG. 3 is a schematic view of a semiconductor chip, illustrating the vicinity of the interface between a metal electrode and an electroconductive adhesive layer.

The following describes the great advantages of a semiconductor chip and a module both according to Embodiment 1 with reference to FIG. 3.

FIG. 3 is a schematic view of a semiconductor chip 20, illustrating the vicinity of the interface between the metal electrode 25 (FIG. 1B) and the electroconductive adhesive layer 72 (FIG. 2). Although the electroconductive adhesive layer 72 contains multiple electroconductive microparticles and multiple chemical species, FIG. 3 only illustrates epoxy resin. On the surface of the metal electrode 25 are oxygen atoms, for example those in a metal oxide layer formed on the surface. The adhesion between the metal electrode 25 and the electroconductive adhesive layer 72 results from the hydrogen bonding between the oxygen atoms on the surface of the metal electrode 25 and the hydroxy groups in the epoxy resin. That is, the adhesion is stronger with increasing susceptibility of the metal to oxidation.

The primary ingredient of the electroconductive adhesive layer 72 can be a non-epoxy resin that contains a functional group capable of hydrogen bonding with oxygen. For example, acrylic, bismaleimide, butadiene, and silicone resins and mixtures thereof can be used.

In Embodiment 1, both the first metal film 27, made of the first metal, and the second metal film 28, made of the second metal, are exposed on the surface of the metal electrode 25. The first and second metals have different standard electrode potentials. The metal film with the lower standard electrode potential is more likely to form an oxide layer on its surface than that with the higher standard electrode potential. The film metal with the lower standard electrode potential therefore provides improved adhesion to the electroconductive adhesive layer 72. The metal film with the higher standard electrode potential is less likely to form oxide on its surface. The metal film with the higher standard electrode potential therefore controls the increase of parasitic resistance. Controlling the increase of parasitic resistance will limit the deterioration of the electrical characteristics of the module 40 (FIG. 2). In this way, in Embodiment 1, exposing two metal films with different standard electrode potentials on the surface of the metal electrode 25 strengthens the adhesion between the semiconductor chip 20 and the electroconductive adhesive layer 72 while maintaining good electrical characteristics.

In Embodiment 1, the first metal film 27 is made of Cu, and the second metal film 28 is made of Au. Au has a standard electrode potential higher than that of Cu. The first metal film 27, made of Cu, therefore strengthens adhesion, and the second metal film 28, made of Au, controls the increase of parasitic resistance. Since gold is much less oxidizable than other metals, the use of a second metal film 28 made of gold leads to more effective retention of electrical characteristics. Copper is a metal used in commonly used electrodes, and, thus, the use of a first metal film 27 made of copper leads to lower costs.

In Embodiment 1, the strengthened adhesion at the interface between the semiconductor chip 20 and the electroconductive adhesive layer 72 advantageously improves the peel resistance of the semiconductor chip 20. This will prevent the semiconductor chip 20 from delamination during reflow soldering in a high-temperature and high-humidity environment, for example after the semiconductor chip 20 has been mounted onto a module substrate 41.

In Embodiment 1, the second metal film 28 (FIG. 1B) is on the first metal film 27 (FIG. 1B). This means that a difference in height exists between the regions in which the first metal film 27 is exposed (first metal film 27 regions) and the regions in which the second metal film 28 is exposed (second metal film 28 regions), corresponding to the thickness of the second metal film 28. The difference in height increases the surface area of the metal electrode 25, reinforcing the adhesion between the metal electrode 25 (FIG. 1B) and the electroconductive adhesive layer 72 (FIG. 2).

The following discusses, as a comparative embodiment, a module in which the metal electrode 25 of the packaged semiconductor chip is made of Au, which has a low electrical resistance and superior resistance to environmental conditions. Since Au is particularly inert to oxidation even as compared with other metals, the semiconductor chip according to this comparative embodiment would have excellent electrical characteristics. The Au metal electrode 25, however, would adhere only weakly to the electroconductive adhesive agent because the electrode is unlikely to form an oxide layer on its surface. The semiconductor chip would therefore delaminate easily from the module substrate during work in a high-temperature and high-humidity environment. A module according to Embodiment 1, in contrast, combines reliability higher than that of the comparative embodiment, in which Au is the only metal exposed on the surface of the metal electrode 25, with sufficiently good electrical characteristics.

Variations of Embodiment 1

Other combinations of metals can be used as materials for the first metal film 27 and the second metal film 28.

FIG. 4 is a chart listing various metals, the formulae of their reducing reactions, and the standard electrode potentials of the metals. Metals with higher standard electrode potentials are more reducible and less oxidizable, and vice versa: metals with lower standard electrode potentials are less reducible and more oxidizable. To take Au versus Cu as an example, Au has a standard electrode potential of +1.50 V, whereas Cu has +0.34 V. Since the standard electrode potential of Cu is smaller than that of Au, Cu is more oxidizable than Au.

For example, a first metal film 27 (FIG. 1B) made of nickel can be used in combination with a second metal film 28 (FIG. 1B) made of a metal that has a standard electrode potential higher than that of nickel, such as silver. Alternatively, it is possible to use a first metal film 27 made of one of the metals listed in FIG. 4 that has a relatively low standard electrode potential in combination with a second metal film 28 made of one with a relatively high standard electrode potential.

In Embodiment 1, the second metal film 28 has a standard electrode potential higher than that of the first metal film 27. The opposite is also possible: the first metal film 27 may have a standard electrode potential higher than that of the second metal film 28. For example, a first metal film 27 made of Au may be used in combination with a second metal film 28 made of Cu. In this case, the second metal film 28 strengthens adhesion, and the first metal film 27 controls the increase of parasitic resistance.

The following describes variations with different structures of the metal electrode 25 (FIG. 1B) and the via hole 23 (FIG. 1C), referring to FIGS. 5A to 5F.

FIGS. 5A to 5F are bottom views of the metal electrode 25 of semiconductor chips 20 according to variations of Embodiment 1. In the variation illustrated in FIG. 5A, the arrangement of the first metal film 27 regions and the second metal film 28 regions is the same as that in Embodiment 1, illustrated in FIG. 1C. In this variation, the substrate has multiple, for example two, via holes 23. Every via hole 23 is in a first metal film 27 region. With multiple via holes 23, the resistance between the element assembly 22 (FIG. 1B) and the metal electrode 25 (FIG. 1B) is lower than with one via hole.

In the variation illustrated in FIG. 5B, the substrate has multiple via holes with different two-dimensional shapes. For example, at least one via hole 23 is substantially round in plan view, and at least one different via hole 23 is elongated in plan view, for example a substantially rectangular hole with substantially hemispherical portions on the short sides. A first metal film 27 region is shaped to the two-dimensional shape of a via hole 23 so that the via hole 23 is in this region. As such, if multiple via holes 23 with different two-dimensional shapes are used, it is recommended to change the two-dimensional shape of the first metal film 27 regions in accordance with that of the via holes 23.

As in the variations illustrated in FIGS. 5A and 5B, the electrode may have first metal film 27 regions and second metal film 28 regions intermingled in two-dimensional directions.

In the variation illustrated in FIG. 5C, the first metal film 27 regions each have a substantially round two-dimensional shape. The first metal film 27 regions are discrete in the second metal film 28 region. In this case, too, the via hole 23 is in a substantially round first metal film 27 region.

In the variation illustrated in FIG. 5D, the first metal film 27 regions each have a substantially rectangular two-dimensional shape. The first metal film 27 regions are discrete in the second metal film 28 region. Although in FIG. 5D the first metal film 27 regions are arranged regularly, substantially in rows and columns, other patterns can also be used.

As in the variations illustrated in FIGS. 5C and 5D, the electrode may have multiple discrete first metal film 27 regions in a continuous second metal film 28 region. The opposite is also possible: the electrode may have multiple discrete second metal film 28 regions in a continuous first metal film 27 region.

In the variation illustrated in FIG. 5E, multiple first metal film 27 regions and multiple second metal film 28 regions are substantially in a stripe pattern. The via hole 23 is in a substantially belt-shaped first metal film 27 region. In FIG. 5E, the bottom surface of the semiconductor chip 20 is substantially rectangular, and the stripe of the first metal film 27 regions and the second metal film 28 regions is substantially parallel to the long sides of the bottom surface. In another configuration, the stripe may be parallel to the short sides of the bottom surface.

As in the variation illustrated in FIG. 5E, the electrode may have first metal film 27 regions and second metal film 28 regions intermingled in a one-dimensional direction.

In the variation illustrated in FIG. 5F, the surface of the metal electrode 25 is divided into two regions, the first metal film 27 exposed in one and the second metal film 28 in the other. The via hole 23 is in the first metal film 27 region. As such, the surface of the metal electrode 25 may be divided into two or more regions in each of which one of two metals with different standard electrode potentials is exposed.

As can be seen from the variations illustrated in FIGS. 5A to 5F, the pattern of first metal film 27 regions and second metal film 28 regions can vary widely.

In Embodiment 1, two metals with different standard electrode potentials are exposed on the surface of the metal electrode 25 of a semiconductor chip 20. It is recommended to expose the two metals with different standard electrode potentials on the surface of the die pad 42 on the module substrate 41 likewise. This strengthens the adhesion between the die pad 42 and the electroconductive adhesive layer 72 (FIG. 2) while maintaining the electrical characteristics of the interface therebetween.

In Embodiment 1, illustrated in FIG. 1C, and its variations, in FIGS. 5A to 5F, the via hole(s) 23 is in a first metal film 27 region. The via hole(s) 23 may be in a second metal film 28 region in other configurations, but preferably, as described hereinafter, no via hole 23 crosses a boundary between a first metal film 27 region and a second metal film 28 region.

Embodiment 2

Figure 6A:
FIG. 6A is a plan view of a semiconductor chip according to Embodiment 2.
Figure 6B:
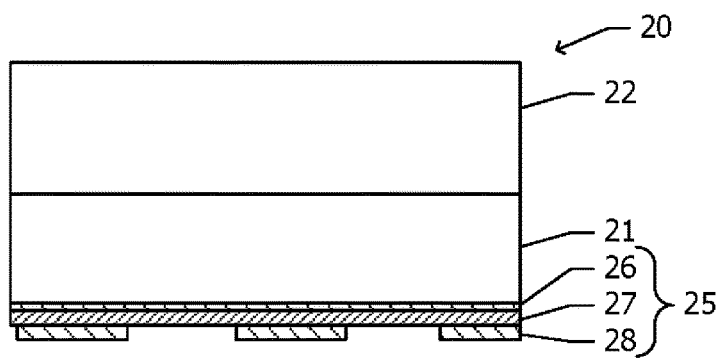
FIG. 6B is a cross-sectional view taken along the dash-dotted line 6B-6B of FIG. 6A.
Figure 6C:
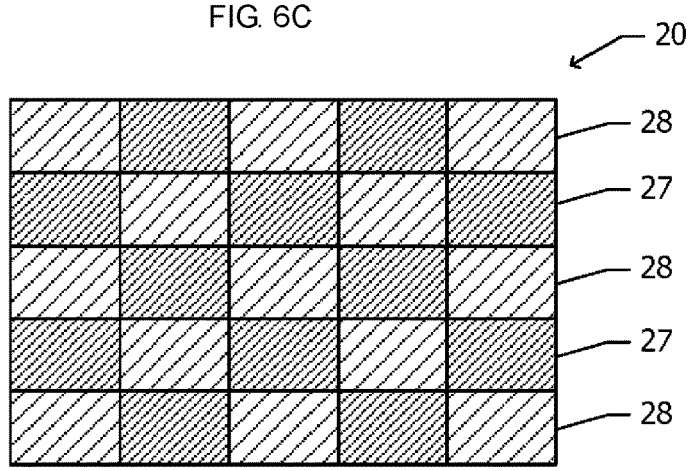
FIG. 6C is a bottom view of the semiconductor chip according to Embodiment 2.

The following describes a semiconductor chip according to Embodiment 2 with reference to FIGS. 6A to 6C. In the following, the structural features this chip has in common with a semiconductor chip 20 according to Embodiment 1 (FIGS. 1A, 1B, and 1C) are not detailed, and the components of the semiconductor chip according to Embodiment 2 are referenced by the same numerals as the corresponding components of the semiconductor 20 according to Embodiment 1.

FIG. 6A is a plan view of a semiconductor chip 20 according to Embodiment 2, FIG. 6B is a cross-sectional view taken along the dash-dotted line 6B-6B of FIG. 6A, and FIG. 6C is a bottom view of the semiconductor chip 20 according to Embodiment 2. In Embodiment 2, the substrate 21 has no via hole 23 (FIG. 1B).

The metal electrode 25 is, as in Embodiment 1 (FIG. 1B), composed of a base film 26, a first metal film 27, and a second metal film 28. As illustrated in FIG. 6C, first metal film 27 regions and second metal film 28 regions are substantially in a checkerboard pattern, like those in Embodiment 1 (FIG. 1C).

In Embodiment 2, the substrate 21 is a compound semiconductor with acquired n-type or p-type electroconductivity. The metal electrode 25 is electrically coupled to an element assembly 22 by the electroconductive substrate 21.

In Embodiment 2, too, the adhesion between the semiconductor chip 20 and the electroconductive adhesive layer 72 (FIG. 2) is strengthened in the same way as in Embodiment 1.

Embodiment 3

Figure 7:
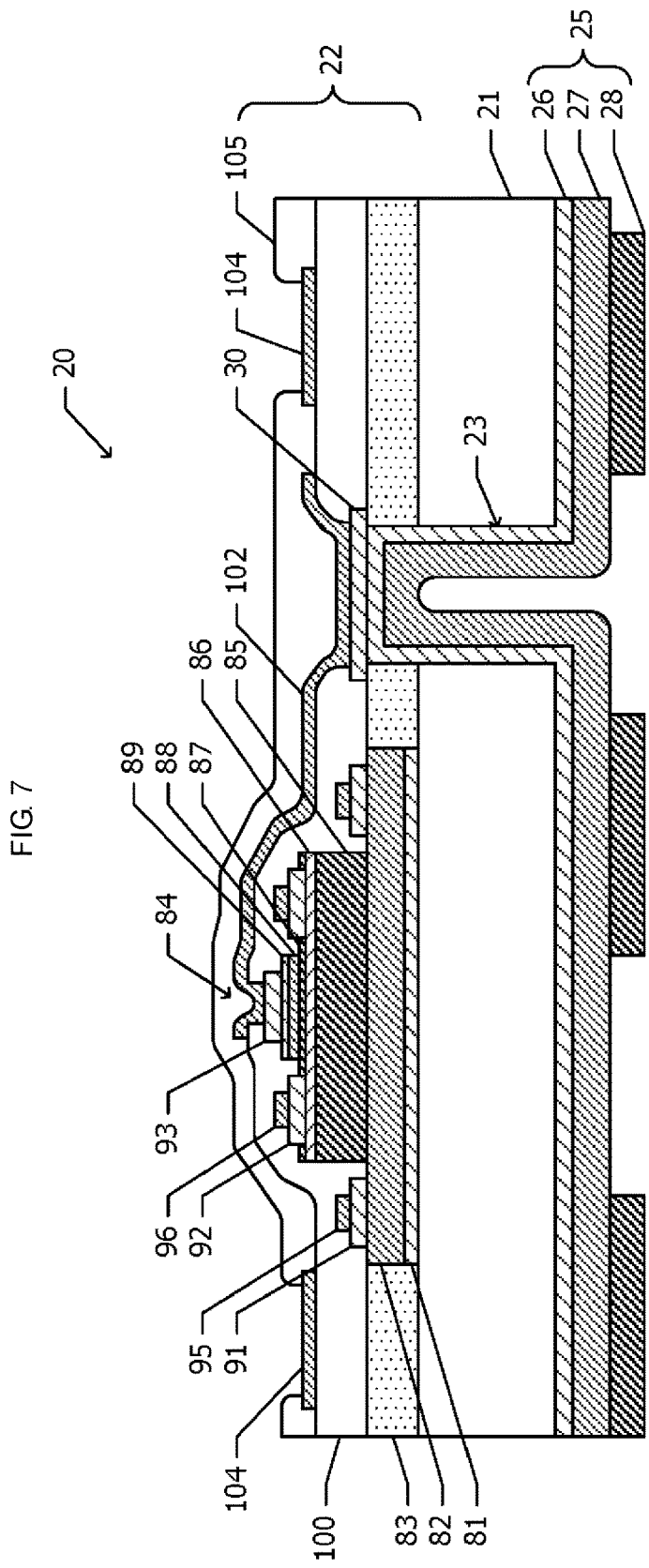
FIG. 7 is a cross-sectional view of a semiconductor chip according to Embodiment 3.

The following describes a semiconductor chip 20 according to Embodiment 3 with reference to FIG. 7. In the following, structural features equivalent to those of a semiconductor chip 20 according to Embodiment 1 are not detailed, and the components of the semiconductor chip according to Embodiment 3 are referenced by the same numerals as the corresponding components of the semiconductor 20 according to Embodiment 1.

FIG. 7 is a cross-sectional view of a semiconductor chip 20 according to Embodiment 3. The element assembly 22, on the top surface of the substrate 21, includes a heterojunction bipolar transistor (HBT) 84. The following describes the structure of the element assembly 22. The structure of the substrate 21, via hole 23, and metal electrode 25 is the same as in a semiconductor chip 20 according to Embodiment 1 (FIG. 1B).

On a semi-insulating GaAs substrate 21 is a stack of an undoped-GaAs buffer layer 81, which is a layer of undoped GaAs, and a subcollector layer 82, which is a layer of n-type GaAs. The buffer layer 81 and the subcollector layer 82 have been implanted with hydrogen (H) or helium (He) except in the region in which the HBT is present, forming an insulating implantation region 83.

On the subcollector layer 82 is the HBT 84. The HBT 84 includes a collector layer 85, which is a layer of n-type GaAs, a base layer 86, which is a layer of p-type GaAs, and an emitter layer 87, which is a layer of n-type InGaP. On a part of the emitter layer 87 is a stack of contact layers 88 and 89, which are a layer of n-type GaAs and a layer of n-type InGaAs, respectively. Although the cross-section in FIG. 7 presents only one HBT 84, there are other HBTs on the rest of the substrate 21. The one semiconductor chip 20 therefore includes multiple HBTs. Besides the HBTs, the element assembly 22 includes components such as wiring between the HBTs.

There is a collector electrode 91 on the top surface of the subcollector layer 82, forming an ohmic contact. A part of the emitter layer 87 is a cavity, in which there is a base electrode 92. The base electrode 92 forms an ohmic contact with the base layer 86. On the top surface of the contact layer 89 is an emitter electrode 93. The emitter electrode 93 is ohmically coupled to the emitter layer 87 by the contact layers 89 and 88.

There is collector wiring 95 on the collector layer 91, and base wiring 96 on the base electrode 92. On the insulating implantation region 83 is a via-hole coupling pad 30.

The insulating implantation region 83, HBT 84, via-hole coupling pad 30, collector wiring 95, and base wiring 96 are covered with an interlayer insulating film 100, a film of SiN. The interlayer insulating film 100 has a cavity through which the via-hole coupling pad 30 is exposed and a cavity through which the emitter electrode 93 is exposed. Emitter wiring 102 formed on the interlayer insulating film 100 couples the emitter electrode 93 and the via-hole coupling pad 30 together. On the interlayer insulating film 100 are multiple bonding pads 104. Each of the bonding pads 104 is coupled to a certain component, for example to the collector electrode 91 or the base electrode 92. The interlayer insulating film 100, emitter wiring 102, and bonding pads 104 are covered with a passivation film 105, a film of SiN. The passivation film 105 has cavities through which the bonding pads 104 are exposed.

The following describes a method for producing a semiconductor chip 20 according to Embodiment 3 with reference to FIGS. 8 to 18. FIGS. 8 to 18 are cross-sectional views of the semiconductor chip 20 in production.

Figure 8:
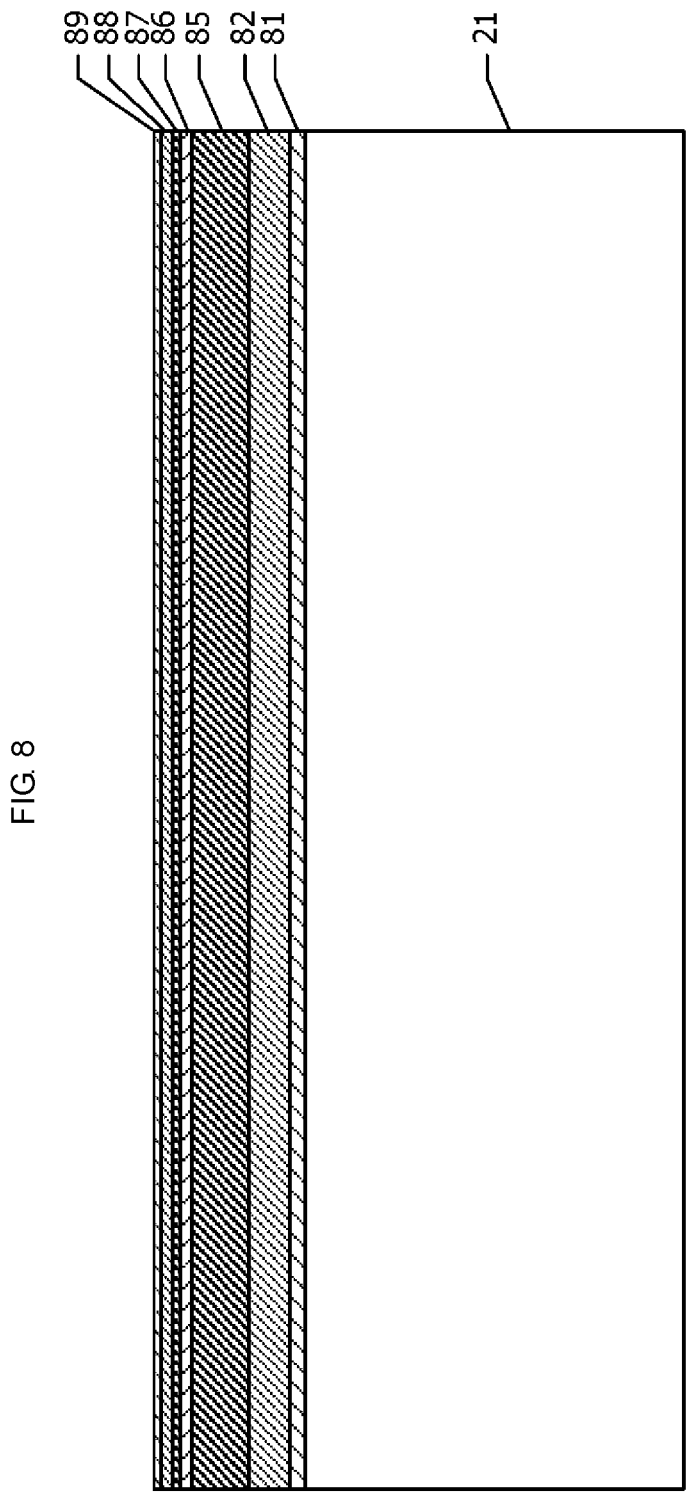
FIG. 8 is a cross-sectional view of a semiconductor chip according to Embodiment 3 in production.

As in FIG. 8, on a substrate 21, layers from a buffer layer 81 to a contact layer 89 are formed one after another by metal organic vapor phase epitaxy (MOVPE). The substrate 21 is made of semi-insulating GaAs and is about 650 μm thick. The top surface of the substrate 21 is a (001) plane with an off-angle of within about ±4°. The buffer layer 81 is a layer of undoped GaAs with a thickness of about 0.1 μm. The subcollector layer 82 is a layer of n-type GaAs doped with about $5 \times 10^{18}$ cm$^{-3}$ of silicon (Si) and having a thickness of about 0.6 μm. The collector layer 85 is a layer of n-type GaAs doped with about $1 \times 10^{16}$ cm$^{-3}$ of Si and having a thickness of about 1.0 μm. The base layer 86 is a layer of p-type GaAs doped with about $5 \times 10^{19}$ cm$^{-3}$ of carbon (C) and having a thickness of about 96 nm. The emitter layer 87 is a layer of n-type InGaP, the molar ratio of InP being about 0.48, doped with about $4 \times 10^{17}$ cm$^{-3}$ of Si and having a thickness of about 35 nm. The contact layer 88 is a layer of n-type GaAs doped with about $5 \times 10^{18}$ cm$^{-3}$ of Si and having a thickness of about 50 nm. The contact layer 89 is a layer of n-type InGaAs, the molar ratio of InAs being 0.5, doped with about $1 \times 10^{19}$ cm$^{-3}$ of Si and having a thickness of about 50 nm.

Figure 9:
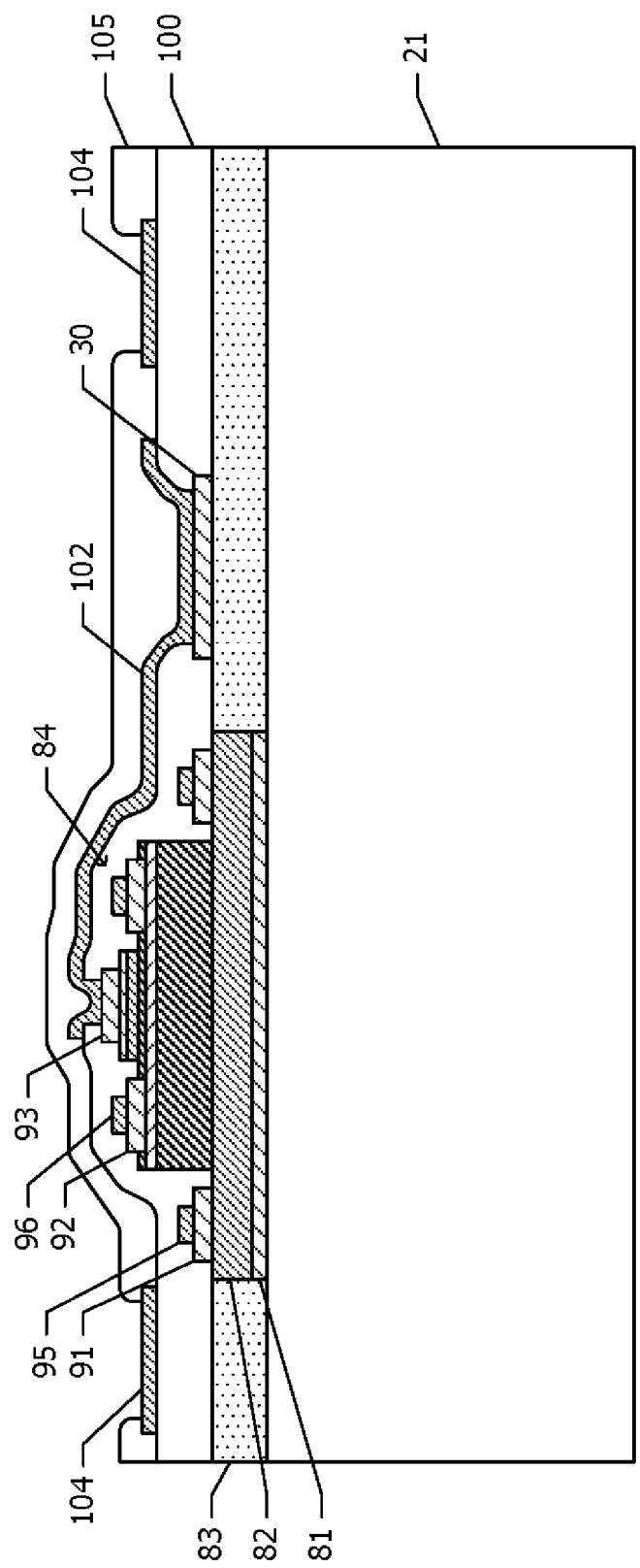
FIG. 9 is a cross-sectional view of a semiconductor chip according to Embodiment 3 in production.

As in FIG. 9, the buffer layer 81 and the subcollector layer 82 are partly implanted with insulating ions, such as H or He, to form an insulating implantation region 83. Then, HBTs 84 and a via-hole coupling pad 30 are formed using ordinary semiconductor processes. The collector electrode 91 and the via-hole coupling pad 30 are each a stack of an about 60-nm thick AuGe film, an about 10-nm thick Ni film, and an about 200-nm thick Au film, from the substrate 21 side. The base electrode 92 is a stack of an about 50-nm thick Ti film, an about 50-nm thick Pt film, and an about 200-nm thick Au film, from the substrate 21 side. The emitter electrode 93 is a stack of an about 10-nm thick Mo film, an about 5-nm thick Ti film, an about 30-nm thick Pt film, and an about 200-nm thick Au film, from the substrate 21 side. The collector wiring 95 and the base wiring 96 are about 1-μm thick Au films.

After the formation of the collector wiring 95 and the base wiring 96, an interlayer insulating film 100, emitter wiring 102, bonding pads 104, and a passivation film 105 are formed. The interlayer insulating film 100 and the passivation film 105 are films of SiN. The emitter wiring 102 and the bonding pads 104 are about 4-μm thick Au films.

Figure 10:
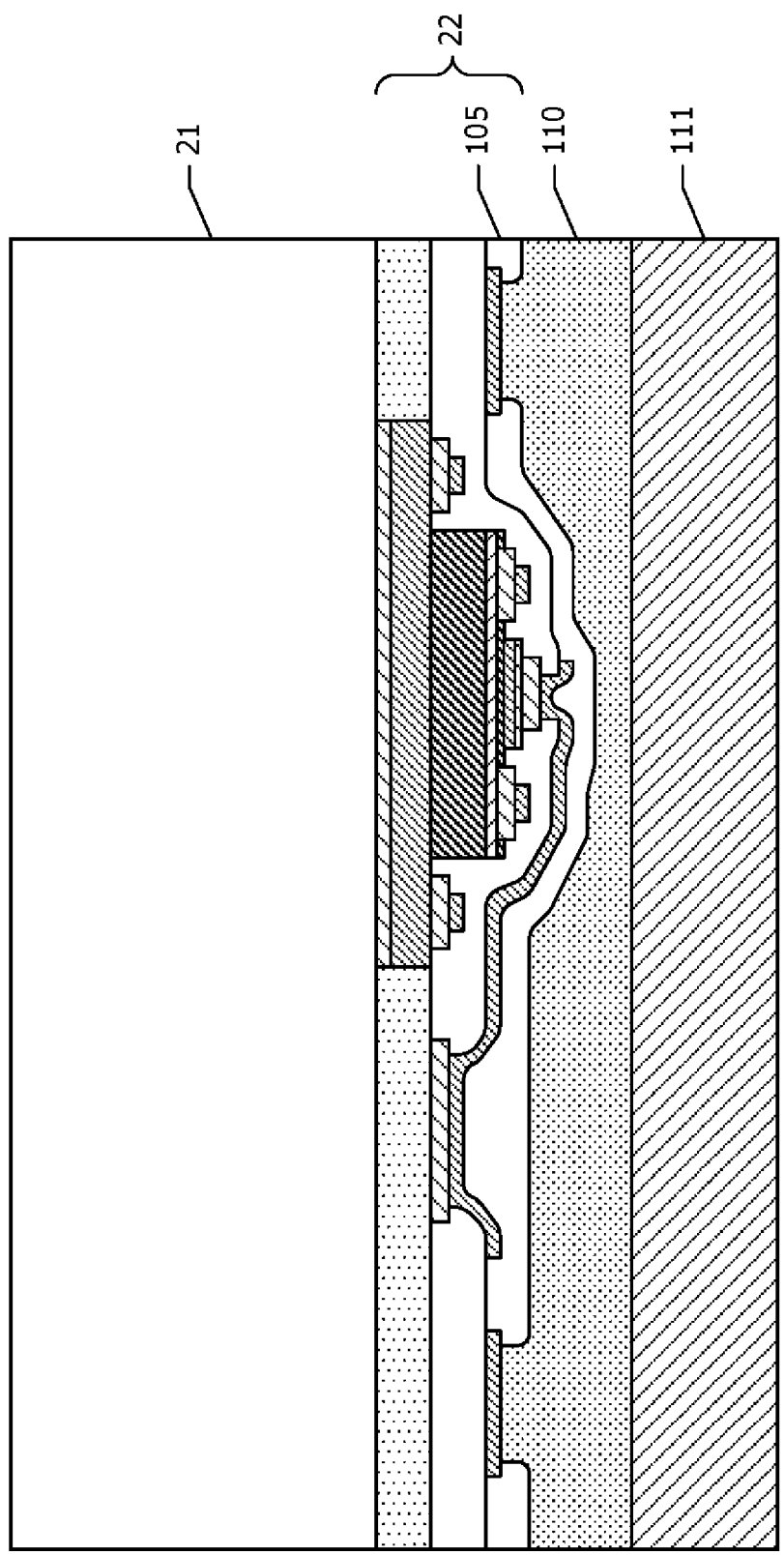
FIG. 10 is a cross-sectional view of a semiconductor chip according to Embodiment 3 in production.

As in FIG. 10, the substrate 21 is turned upside down, and its passivation film 105 side is joined to a sapphire substrate 111 with wax 110.

Figure 11:
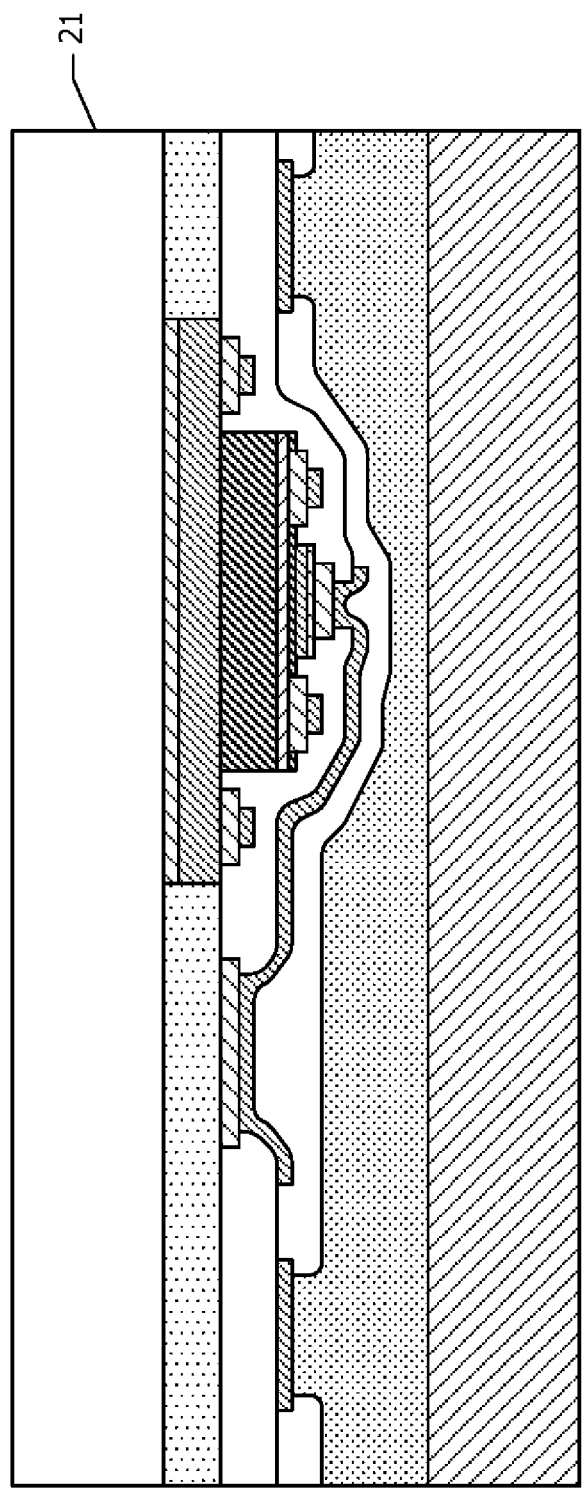
FIG. 11 is a cross-sectional view of a semiconductor chip according to Embodiment 3 in production.

As in FIG. 11, the substrate 21 is ground to a thickness of about 75 μm.

Figure 12:
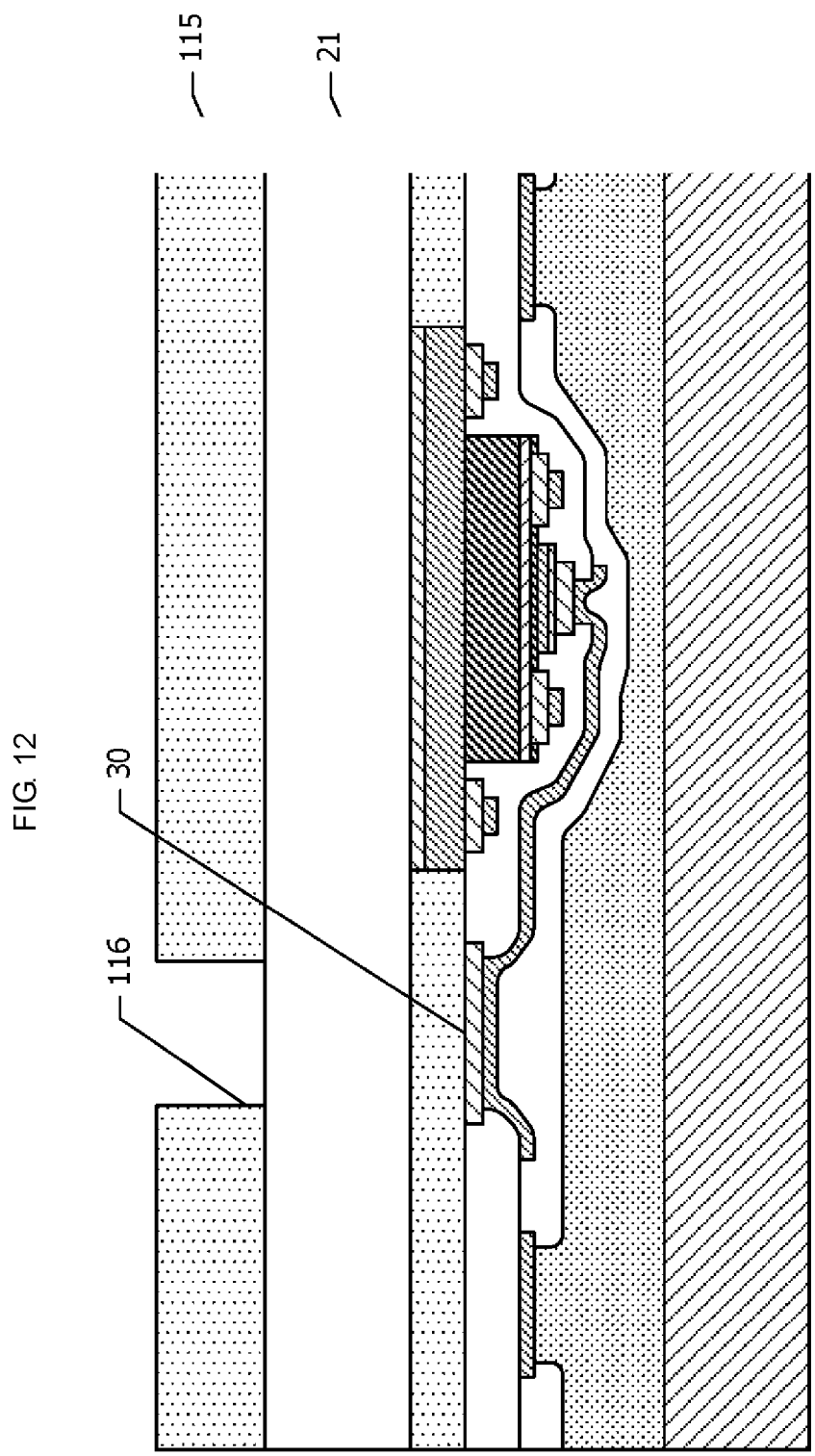
FIG. 12 is a cross-sectional view of a semiconductor chip according to Embodiment 3 in production.

As in FIG. 12, a photoresist film 115 is formed on the bottom surface (surface facing upward in FIG. 12) of the substrate 21 and is perforated to create a cavity 116. The cavity 116 is created at the position where the via-hole coupling pad 30 is in the substrate 21. The substrate 21 becomes exposed at the bottom of the cavity 116.

Figure 13:
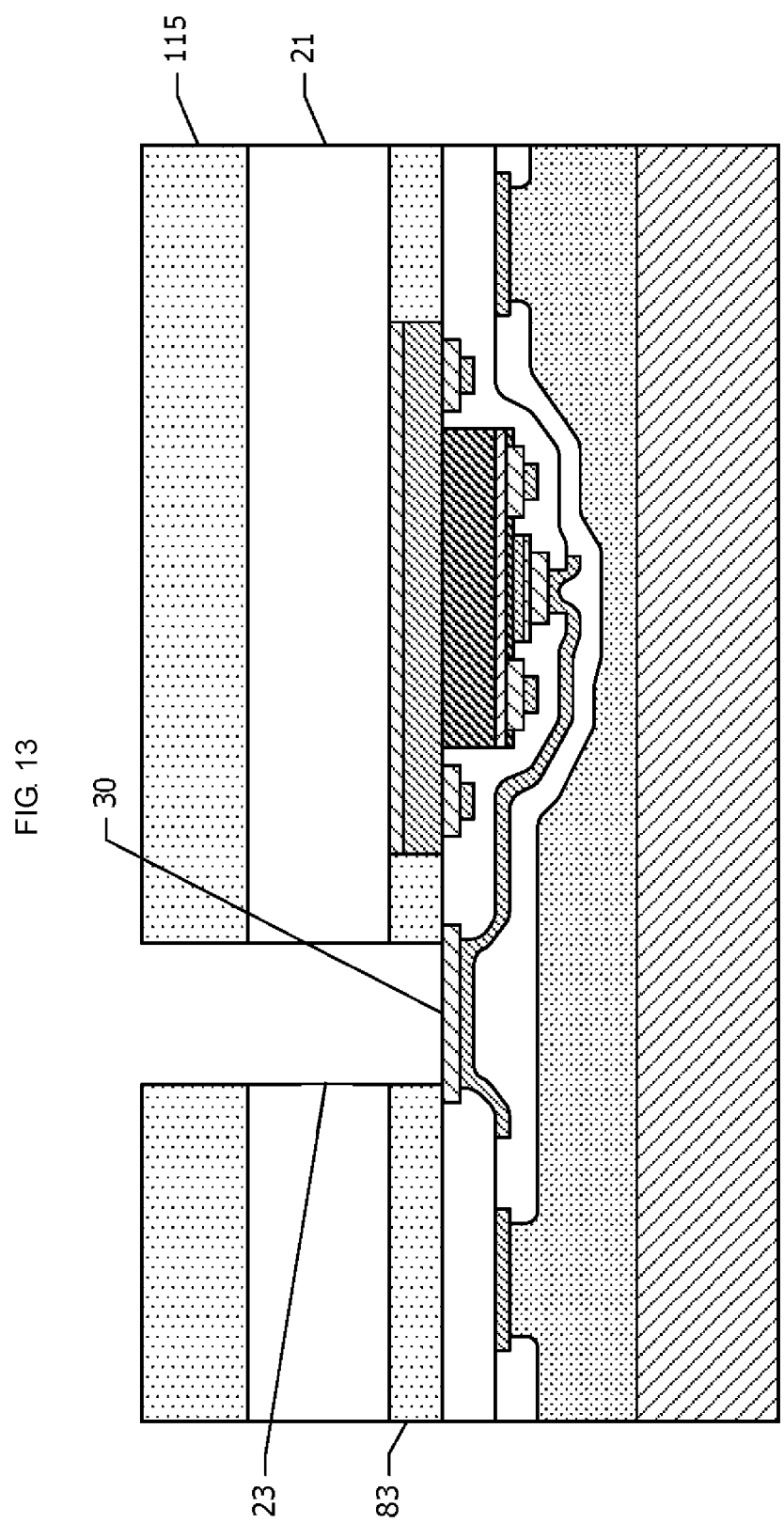
FIG. 13 is a cross-sectional view of a semiconductor chip according to Embodiment 3 in production.

As in FIG. 13, the substrate 21 and the insulating implantation region 83 are etched, for example by anisotropic dry etching, with the photoresist film 115 as mask, creating a via hole 23. The via hole 23 reaches the via-hole coupling pad 30. As a result, the via-hole coupling pad 30 becomes exposed in the via hole 23.

Figure 14:
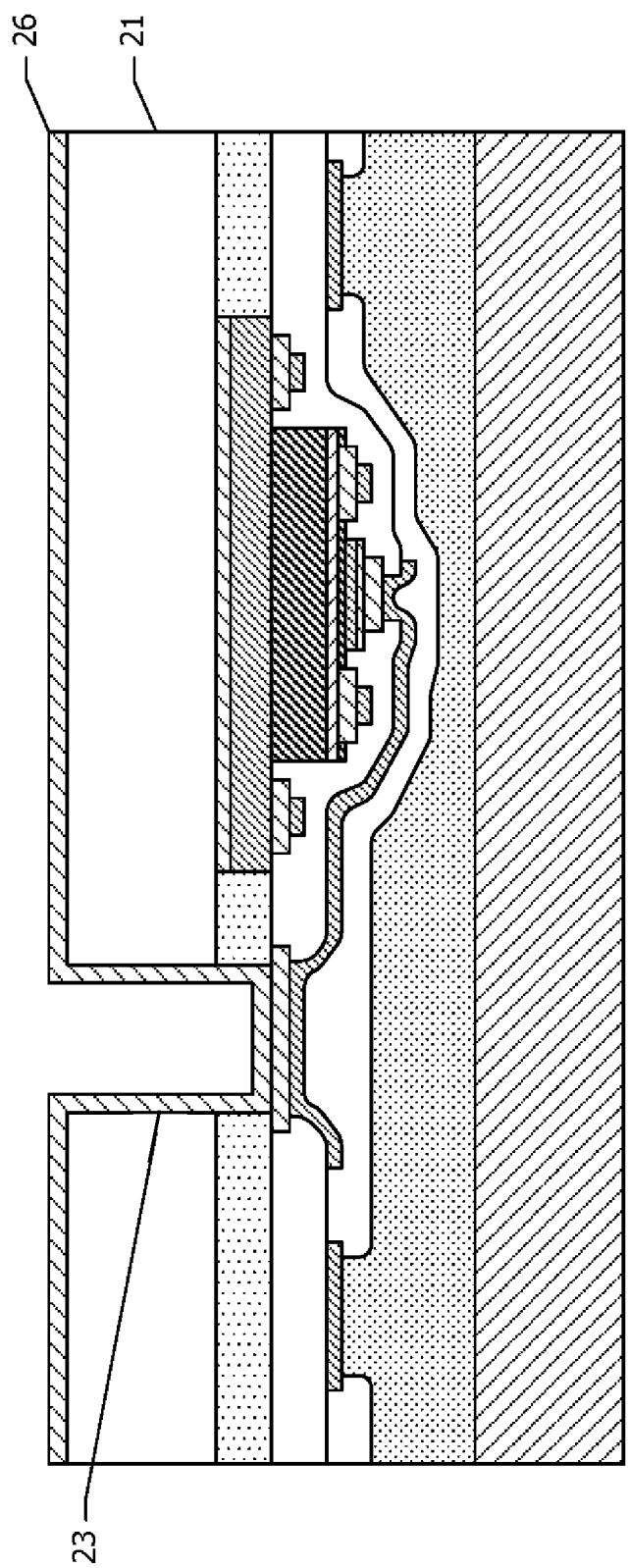
FIG. 14 is a cross-sectional view of a semiconductor chip according to Embodiment 3 in production.

As in FIG. 14, the photoresist film 115 (FIG. 13) is removed. Then, a base film 26 for plating is formed on the bottom surface (surface facing upward in FIG. 14) of the substrate 21 and the inner walls of the via hole 23. The base film 26 is a two-layer stack, an about 0.1-μm thick Ti film and an about 0.1-μm thick Cu film thereon. The Ti and Cu films can be formed by, for example, sputtering.

Figure 15:
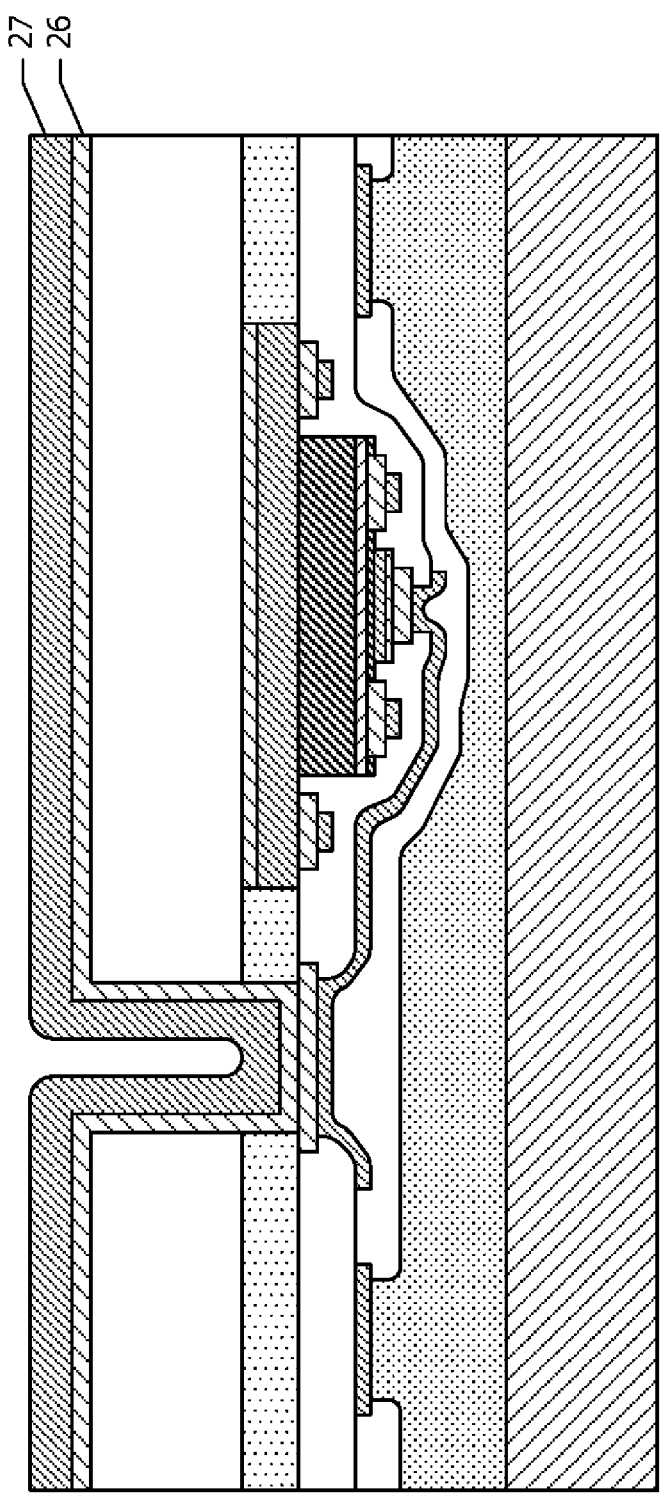
FIG. 15 is a cross-sectional view of a semiconductor chip according to Embodiment 3 in production.

As in FIG. 15, a first metal film 27 is formed by electroplating the base film 26 with Cu. The first metal film 27 is about 4 μm thick.

Figure 16:
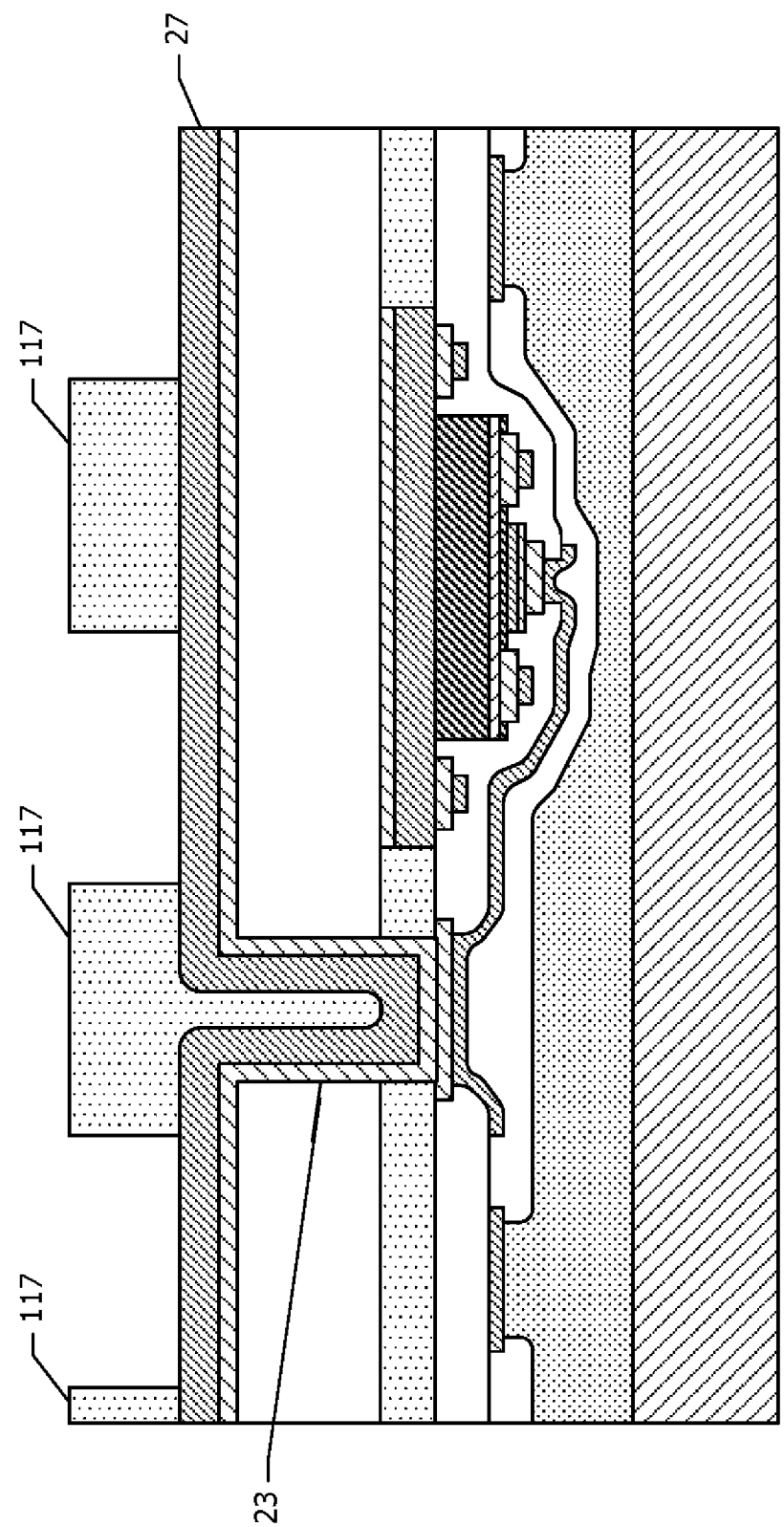
FIG. 16 is a cross-sectional view of a semiconductor chip according to Embodiment 3 in production.

As in FIG. 16, a photoresist film 117 is formed on the first metal film 27 and patterned. The patterned photoresist film 117 covers the regions in which the first metal film 27 is to be exposed (FIG. 1C) and leaves the surface of the first metal film 27 exposed in the regions in which a second metal film 28 is to be exposed (FIG. 1C). The via hole 23 is therefore covered with the photoresist film 117.

Figure 17:
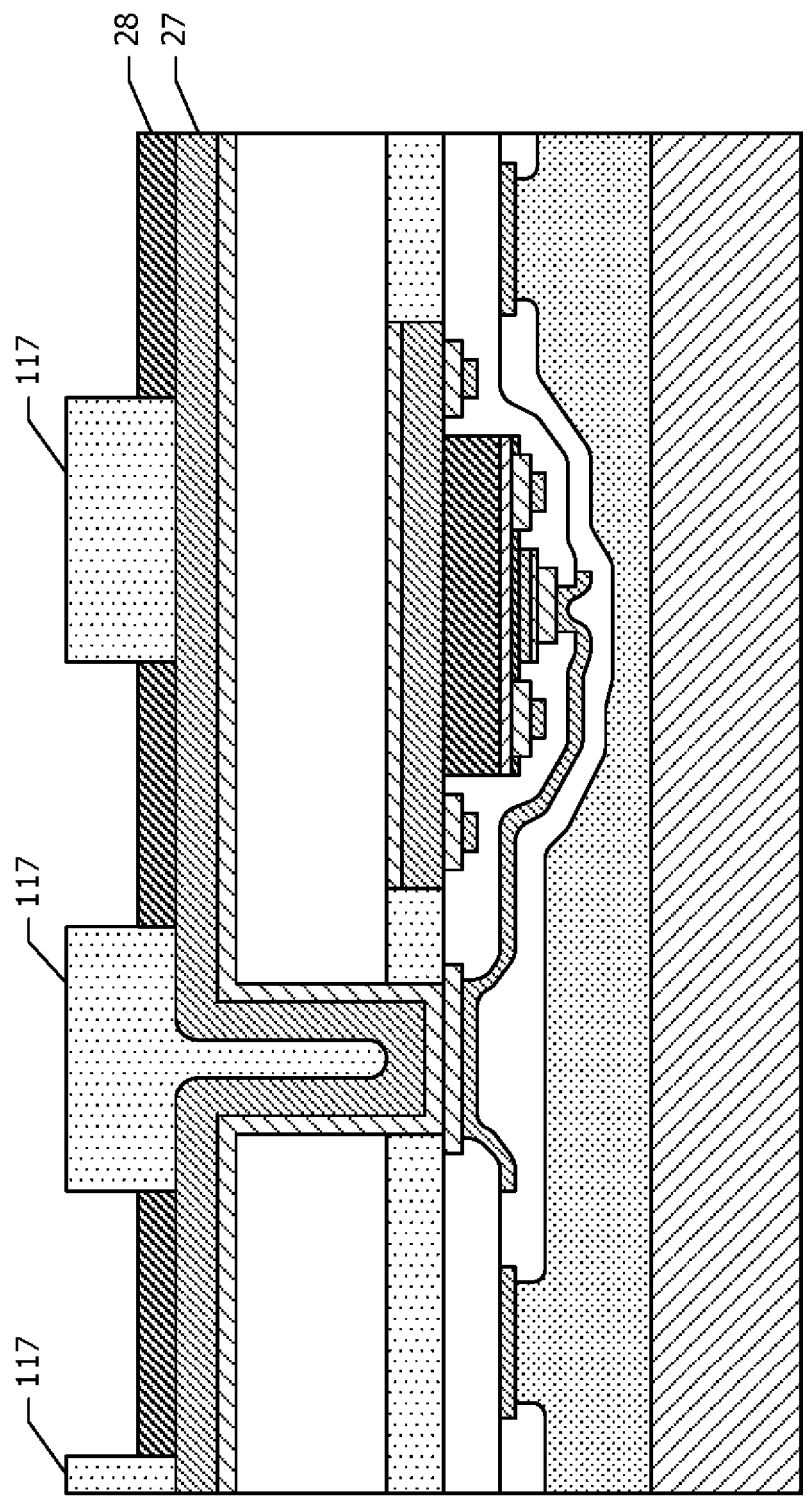
FIG. 17 is a cross-sectional view of a semiconductor chip according to Embodiment 3 in production.

As in FIG. 17, a second metal film 28 is formed by electroplating the first metal film 27 with Au in the regions not covered with the photoresist film 117. The second metal film 28 is about 4 μm thick.

Figure 18:
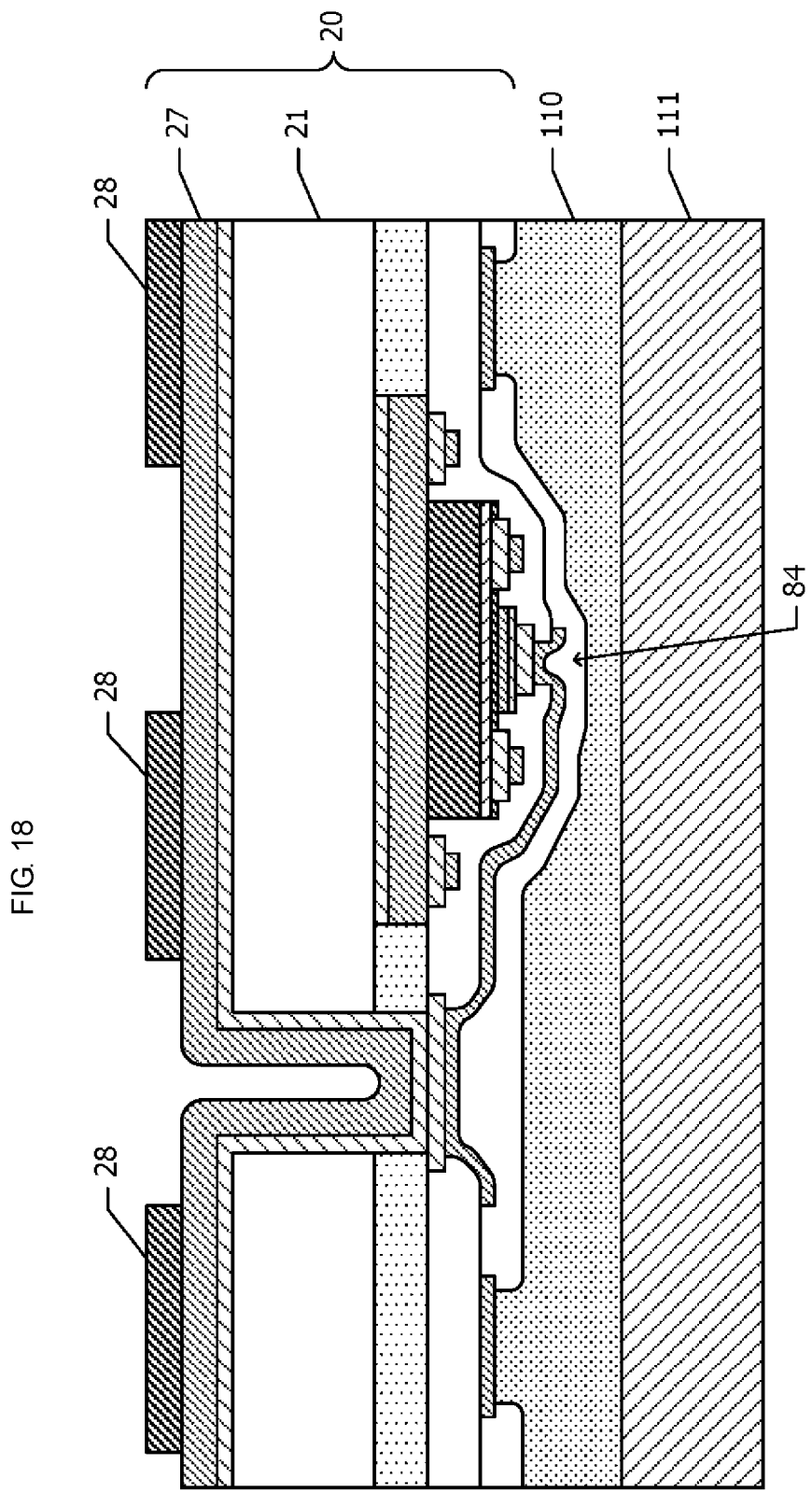
FIG. 18 is a cross-sectional view of a semiconductor chip according to Embodiment 3 in production.

As in FIG. 18, the photoresist film 117 (FIG. 17) is removed. This exposes the first metal film 27 in the regions in which the second metal film 28 has not been formed. Then, the wax 110 and the sapphire substrate 111 are removed from the semiconductor chip 20. The substrate 21 with HBTs 84 and other components thereon is turned upside down and divided into chips, for example by cutting with a dicing machine. Dividing the substrate 21 into chips completes a semiconductor chip 20 as illustrated in FIG. 7.

Advantages of Embodiment 3

The following describes the great advantages of Embodiment 3.

In Embodiment 3, the emitter electrode 93 of HBTs 84 formed in an element assembly 22 (FIG. 7) is electrically coupled to a metal electrode 25 on the bottom surface of a substrate 21 by emitter wiring 102, a via-hole coupling pad 30, and the portion of the metal electrode 25 that lies inside a via hole 23. The metal electrode 25 is coupled to a die pad 42 on a module substrate 41 (FIG. 2) by an electroconductive adhesive layer 72 (FIG. 2). As a result, the parasitic resistance and parasitic inductance between the emitter electrodes 93 and the module substrate 41 in this configuration are small, compared with those in the configuration in which bonding wires are used for coupling to the module substrate 41.

In Embodiment 3, too, the metal electrode 25, formed on the bottom surface of the substrate 21, has first metal film 27 regions and second metal film 28 regions on its surface. When the semiconductor chip 20 is mounted onto a module substrate 41 (FIG. 2), this strengthens the adhesion between the metal electrode 25 and the electroconductive adhesive layer 72 (FIG. 2) in the same way as in Embodiment 1, making the delamination of the semiconductor chip 20 from the module substrate 41 less frequent and improving the reliability of the module in high-temperature and high-humidity environments.

Figure 19:
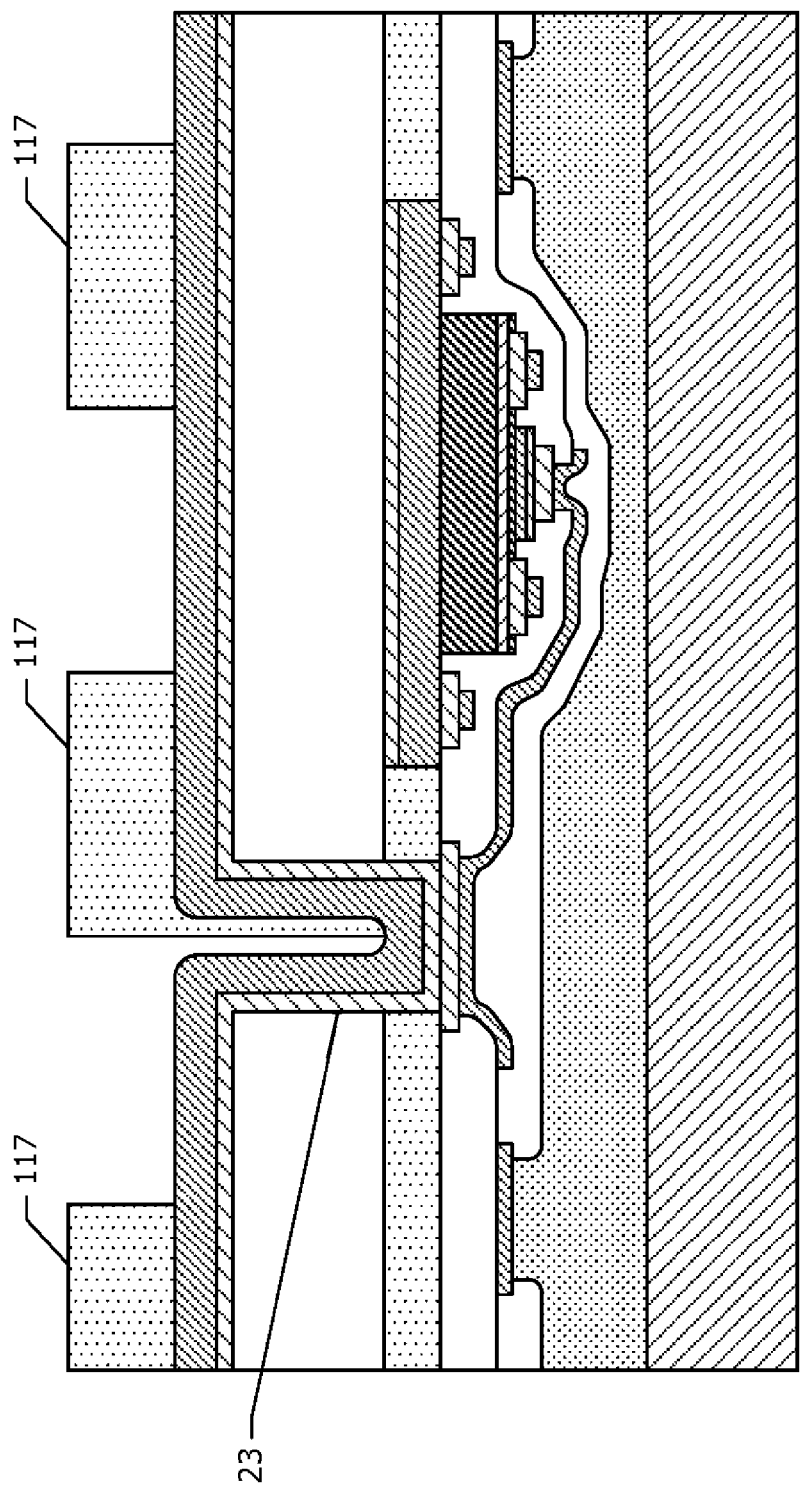
FIG. 19 is a cross-sectional view of a semiconductor chip according to a reference embodiment in production.

The following describes the great advantages of Embodiment 3 over a semiconductor chip according to a reference embodiment illustrated in FIG. 19.

FIG. 19 is a cross-sectional view of a semiconductor chip according to a reference embodiment in production that corresponds to the cross-sectional view of Embodiment 3 in production in FIG. 16. Whereas in Embodiment 3 the photoresist film 117 covers the via hole 23 completely, in the reference embodiment, illustrated in FIG. 19, an edge of the photoresist film 117 lies above the via hole 23.

An arrangement in which an edge of the photoresist film 117 lies above the via hole 23 as in FIG. 19 often causes poor exposure in the photolithography of the photoresist film 117. Poor exposure causes some resist to be left in the via hole 23 after the development of the photoresist film 117, resulting in frequent in-process defects.

In Embodiment 3, as can be seen from FIG. 16, the via hole 23 is created out of the regions in which the photoresist film 117 is to be removed by development. This embodiment is, therefore, free from the problem of unnecessary photoresist film 117 left in the via hole 23.

Variation of Embodiment 3

Figure 20:
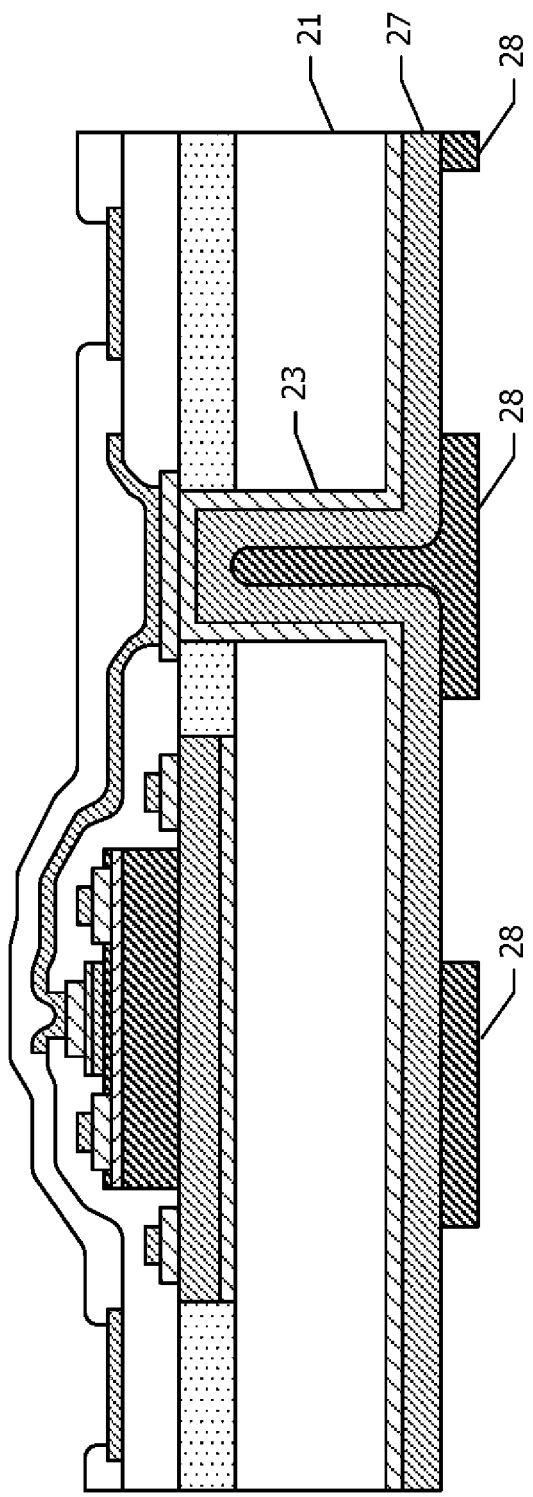
FIG. 20 is a cross-sectional view of a semiconductor chip according to a variation of Embodiment 3.

The following describes a variation of Embodiment 3 with reference to FIG. 20. Poor exposure of the photoresist film 117 (FIGS. 16 and 19) is frequent when a boundary between a region in which the photoresist film 117 stays and a region in which the photoresist film 117 leaves overlaps the via hole 23. In the variation of Embodiment 3, the regions in which the photoresist film 117 stays swap places with the region in which the photoresist film 117 leaves, from Embodiment 3. In this case, too, poor exposure is infrequent, because no boundary between a region in which the photoresist film 117 stays and a region in which the photoresist film 117 leaves overlaps the via hole 23.

FIG. 20 is a cross-sectional view of a semiconductor chip 20 according to a variation of Embodiment 3. In this variation, the via hole 23 will be in a second metal film 28 region. The via hole 23 will be completely filled with the base film 26, first metal film 27, and second metal film 28, without any space therein. This gives the current path from the top surface to the bottom surface of the substrate 21 a larger cross-sectional area, further reducing the emitter resistance. The metal completely filling the via hole 23 also provides a heat path, helping the element assembly 22 dissipate heat to the module substrate 41 (FIG. 2).

Although in Embodiment 3 the substrate 21 is a semi-insulating GaAs substrate, any non-GaAs single-crystal substrate can be used on which the semiconductor layers forming the HBTs 84 (FIG. 7) can grow epitaxially. For example, substrates such as a single-crystal InP substrate, a single-crystal Si substrate, and a single-crystal sapphire substrate can be used.

Embodiment 4

Figure 21:
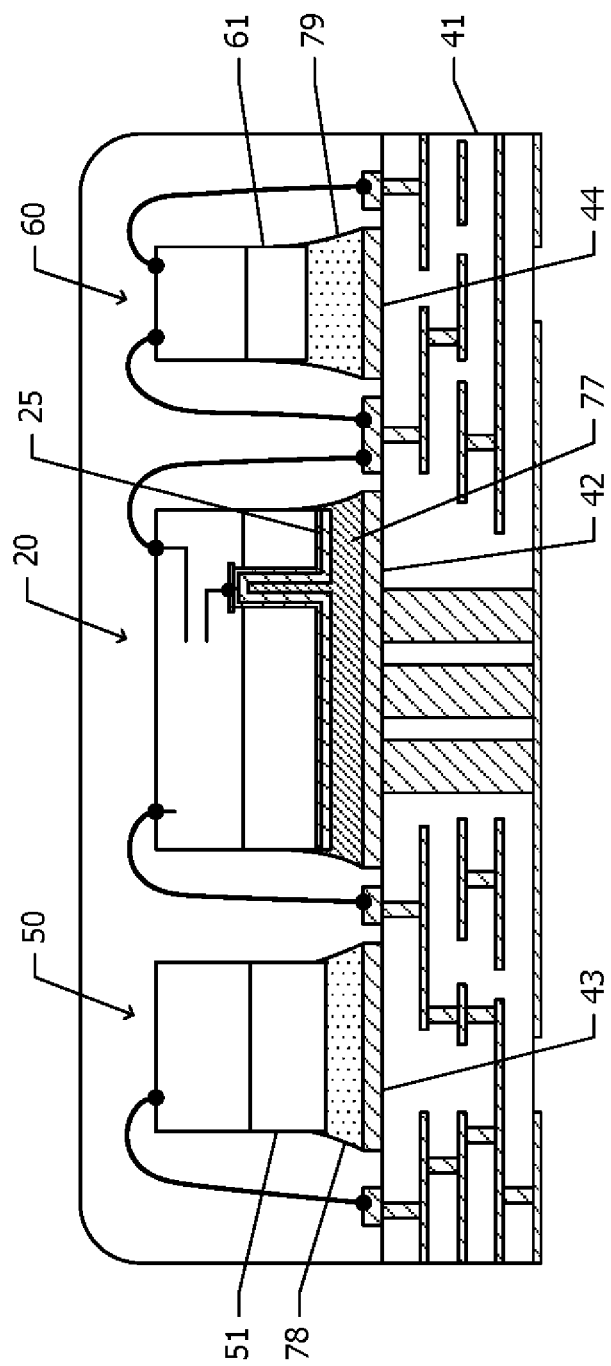
FIG. 21 is a cross-sectional view of a module according to Embodiment 4.

The following describes a module according to Embodiment 4 with reference to FIG. 21. In the following, the structural features the chip and the module have in common with Embodiment 1, illustrated in FIG. 1A to FIG. 2, are not detailed.

FIG. 21 is a cross-sectional view of a module according to Embodiment 4. The structure of the semiconductor chip 20 and the module substrate 41 are the same as that of the semiconductor chip 20 and the module substrate 41 in a module according to Embodiment (FIGS. 1A, 1B, and 1C and FIG. 2, respectively).

Whereas Embodiment 1 uses, as illustrated in FIG. 2, an electroconductive adhesive to mount a semiconductor chip 20 onto a module substrate 41, Embodiment 4 uses solder instead of the electroconductive adhesive. A solder layer 77 is therefore interposed between the semiconductor chip 20 and the die pad 42. The solder layer 77 mechanically fastens the semiconductor chip 20 to the die pad 42 while electrically coupling the metal electrode 25 of the semiconductor chip 20 and the die pad 42 together. The solder layer 77 can be a layer of, for example, a silver (Ag)-tin (Sn) solder that contains Ag and Sn in a ratio by weight of about 1:9.

In Embodiment 1, the second metal film 28, a film of Au, remains even after the semiconductor chip 20 is mounted onto the module substrate 41. In Embodiment 4, the second metal film 28 dissolves in the solder during the soldering. This means that in the resulting module, in which the semiconductor chip 20 has been mounted onto the module substrate 41, the second metal film 28 has been lost. The solder layer 77 therefore contains Au besides Ag and Sn, the components of the solder. Based on the weight of the second metal film 28 before the semiconductor chip 20 is mounted onto the module substrate 41 and the weight of solder used, typical Au content levels range from about 1% by mass to about 35% by mass.

The bottom surfaces of the semiconductor chips 50 and 60, not covered with a metal electrode, are bare surfaces of the silicon substrate 51 and the semi-insulating GaAs substrate 61, respectively. The semiconductor chips 50 and 60 are therefore unsuitable for soldering and mounted onto the module substrate 41 with the use of adhesive layers 78 and 79, respectively. The adhesive layers 78 and 79 do not need to be electroconductive and can be, for example, layers of an insulating adhesive that is primarily epoxy resin.

A semiconductor chip 20 according to Embodiment 1 (FIG. 1B), which has on its bottom surface a metal electrode 25 that has first metal film 27 regions and second metal film 28 regions, can also be mounted onto a module substrate 41 by soldering as in Embodiment 4 (FIG. 21). Both electroconductive adhesive- and solder-mounting work on this semiconductor chip 20.

While preferred embodiments of the disclosure have been described above, it is to be understood that variations and modifications will be apparent to those skilled in the art without departing from the scope and spirit of the disclosure. The scope of the disclosure, therefore, is to be determined solely by the following claims.

What is claimed is:

1. A semiconductor chip comprising:
   a single-crystal substrate;
   a metal electrode on a bottom surface of the substrate, the metal electrode having a region in which a first metal is exposed and a region in which a second metal is exposed, the second metal having a standard electrode potential different from a standard electrode potential of the first metal; and
   a via hole extending from the bottom surface of the substrate to a top surface of the substrate,
   wherein the first metal covers an entire portion of the bottom surface of the substrate and the via hole, and the second metal covers a part of a surface of the first metal covering the bottom surface of the substrate other than the via hole.

2. The semiconductor chip according to claim 1, wherein a surface on which the first metal is exposed and a surface on which the second metal is exposed are at different heights from the bottom surface of the substrate.

3. The semiconductor chip according to claim 1, further comprising:
   an element assembly on a top surface of the substrate, the element assembly including at least one semiconductor element, wherein
   the metal electrode is electrically connected to the element assembly through the via hole.

4. The semiconductor chip according to claim 3, wherein the via hole does not overlap with a boundary between the region of the metal electrode in which the first metal is exposed and the region in which the second metal is exposed.

5. The semiconductor chip according to claim 1, wherein one of the first metal and the second metal is copper, and another one of the first metal and the second metal is gold.

6. The semiconductor chip according to claim 2, further comprising:
   an element assembly on a top surface of the substrate, the element assembly including at least one semiconductor element; and
   a via hole extending from the bottom surface of the substrate to the top surface of the substrate, wherein
   the metal electrode is electrically connected to the element assembly through the via hole.

7. The semiconductor chip according to claim 2, wherein one of the first metal and the second metal is copper, and another one of the first metal and the second metal is gold.

8. The semiconductor chip according to claim 3, wherein one of the first metal and the second metal is copper, and another one of the first metal and the second metal is gold.

9. The semiconductor chip according to claim 4, wherein one of the first metal and the second metal is copper, and another one of the first metal and the second metal is gold.

* * * * *